US012650812B2

(12) United States Patent
　　Tsukamoto

(10) Patent No.: US 12,650,812 B2
(45) Date of Patent: Jun. 9, 2026

(54) SEMICONDUCTOR DEVICE, NONVOLATILE STORAGE APPARATUS, MULTIPLY-ACCUMULATE OPERATION APPARATUS, AND MANUFACTURING METHOD FOR A SEMICONDUCTOR DEVICE

(71) Applicant: SONY SEMICONDUCTOR SOLUTIONS CORPORATION, Kanagawa (JP)

(72) Inventor: Masanori Tsukamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 1082 days.

(21) Appl. No.: 17/637,030

(22) PCT Filed: Aug. 3, 2020

(86) PCT No.: PCT/JP2020/029696
　　§ 371 (c)(1),
　　(2) Date: Feb. 21, 2022

(87) PCT Pub. No.: WO2021/039300
　　PCT Pub. Date: Mar. 4, 2021

(65) Prior Publication Data
　　US 2022/0276836 A1　　Sep. 1, 2022

(30) Foreign Application Priority Data
　　Aug. 28, 2019　(JP) ................................. 2019-156016

(51) Int. Cl.
　　*G06F 7/544*　　(2006.01)
　　*G11C 11/22*　　(2006.01)
　　*H10B 51/30*　　(2023.01)

(52) U.S. Cl.
　　CPC .......... *G06F 7/5443* (2013.01); *G11C 11/223* (2013.01); *G11C 11/2275* (2013.01); *H10B 51/30* (2023.02)

(58) Field of Classification Search
　　CPC . G06F 7/5443; G11C 11/223; G11C 11/2275; H10B 51/30
　　See application file for complete search history.

(56) References Cited

U.S. PATENT DOCUMENTS

2015/0070964 A1　3/2015　Yamada et al.
2019/0156879 A1　5/2019　Tsukamoto

FOREIGN PATENT DOCUMENTS

JP　　　2005503632 A　*　2/2005
JP　　　2008-042114 A　　2/2008
　　　　　　　(Continued)

OTHER PUBLICATIONS

K. Ni et al., "SoC Logic Compatible Multi-Bit FeMFET Weight Cell for Neuromorphic Applications," 2018 IEEE International Electron Devices Meeting (IEDM), San Francisco, CA, USA, 2018, pp. 13.2.1-13.2.4, doi: 10.1109/IEDM.2018.8614496 (Year: 2018).*

(Continued)

*Primary Examiner* — Carlo Waje
(74) *Attorney, Agent, or Firm* — CHIP LAW GROUP

(57) ABSTRACT

A semiconductor device according to an embodiment of the present technology includes a plurality of first wires, a plurality of second wires, a plurality of third wires, and a plurality of memory units. The plurality of first wires is arranged to be parallel to each other. The plurality of second wires is arranged to be parallel and adjacent to the plurality of first wires, respectively. The plurality of third wires is arranged to be orthogonal to the first wires and the second wires. The plurality of memory units each has a nonvolatile memory layer that maintains a state set via the third wire, and an active layer that is arranged obliquely to the third (Continued)

wire and electrically connects the first wire and the second wire adjacent to each other in accordance with the state of the memory layer and is a MOSFET-type.

17 Claims, 16 Drawing Sheets

(56) References Cited

FOREIGN PATENT DOCUMENTS

| | | |
|---|---|---|
| JP | 2015-056485 A | 3/2015 |
| WO | 2017/179314 A1 | 10/2017 |

OTHER PUBLICATIONS

International Search Report and Written Opinion of PCT Application No. PCT/JP2020/029696, issued on Oct. 6, 2020, 11 pages of ISRWO.
Guo, et al., "Fast, Energy-Efficient, Robust, and Reproducible Mixed-Signal Neuromorphic Classifier Based on Embedded NOR Flash Memory Technology", IEEE International Electron Devices Meeting (IEDM), 2017, 4 pages.

* cited by examiner

FIG. 1
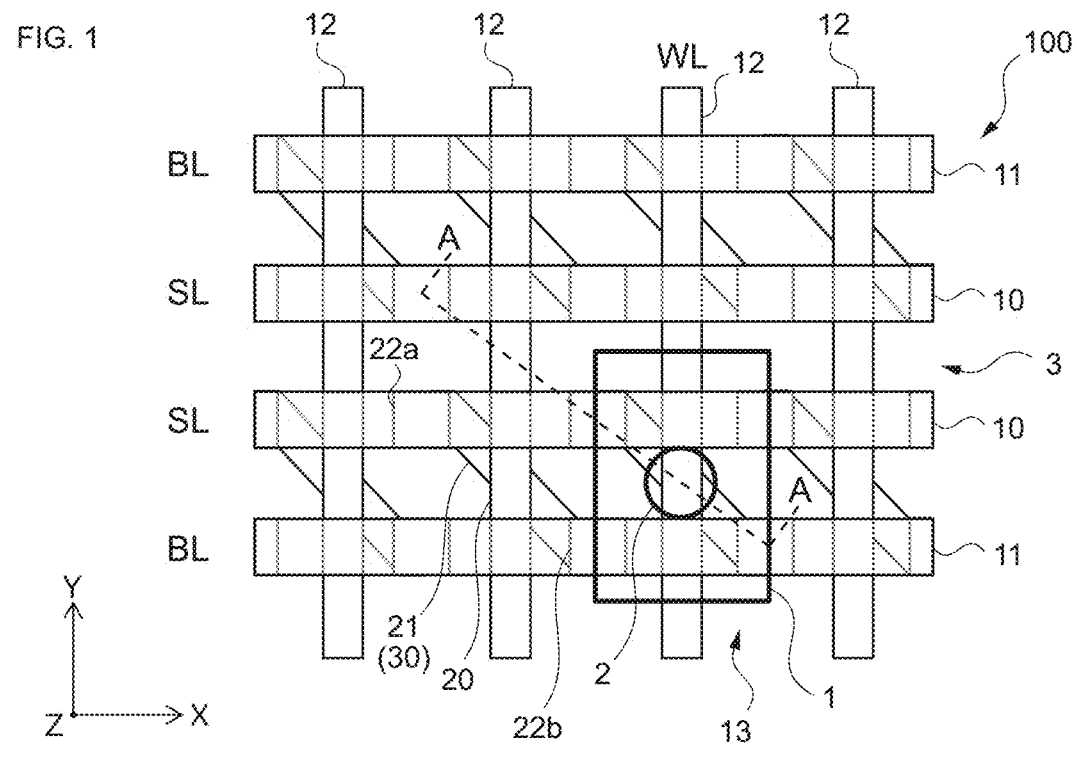
FIG. 2A
FIG. 2B
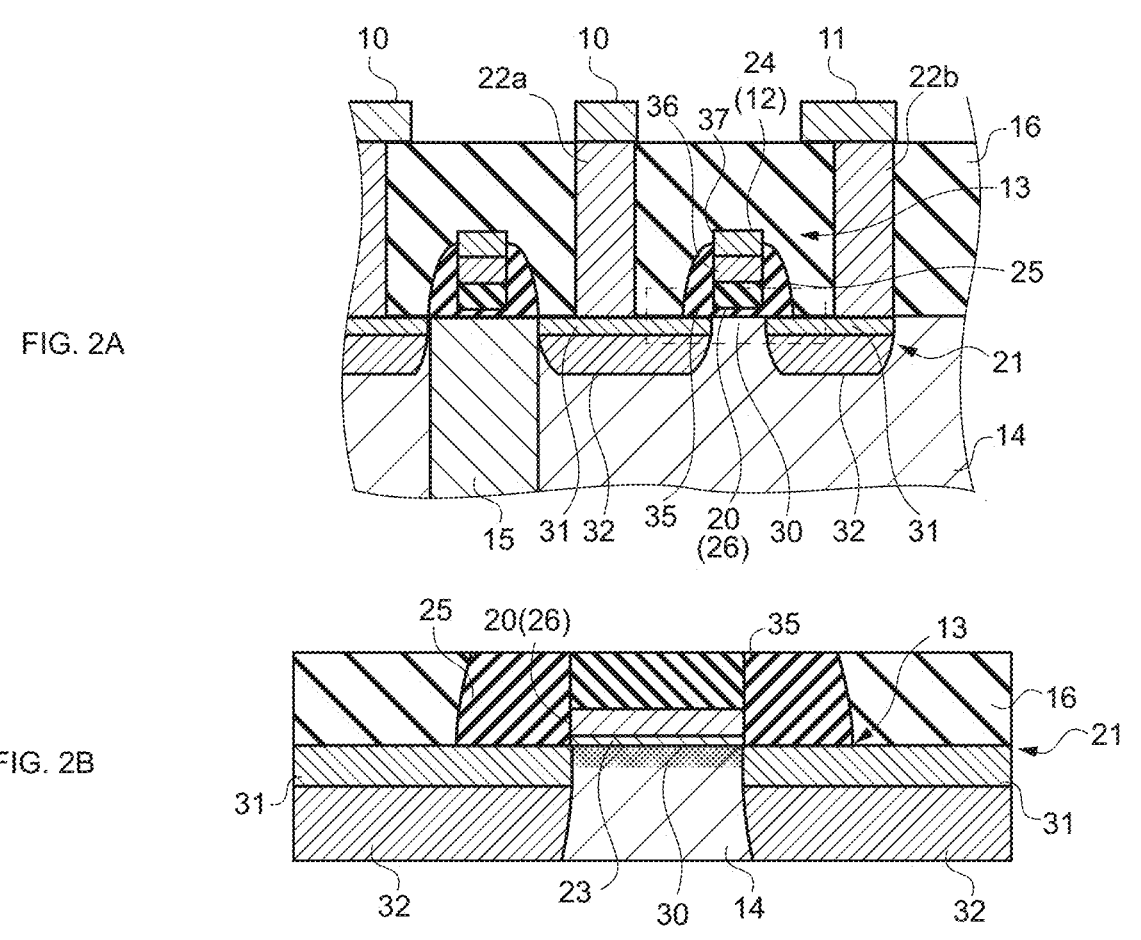

FIG. 5A
FIG. 5D
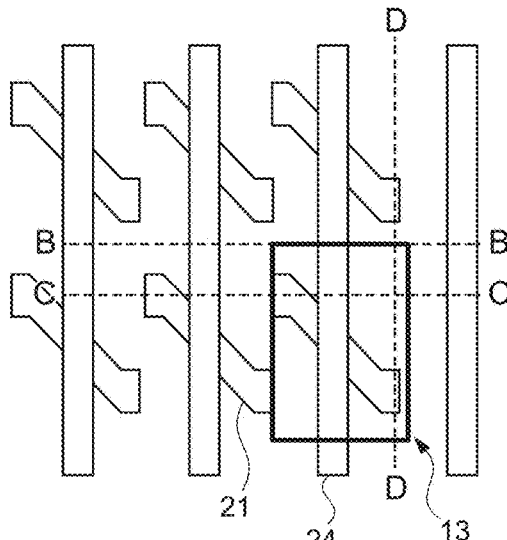
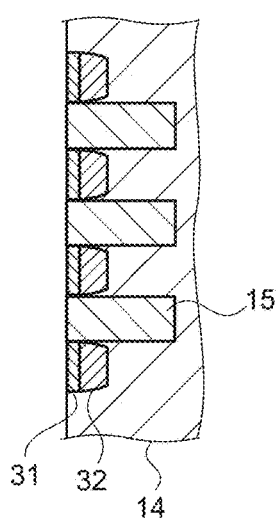
FIG. 5B
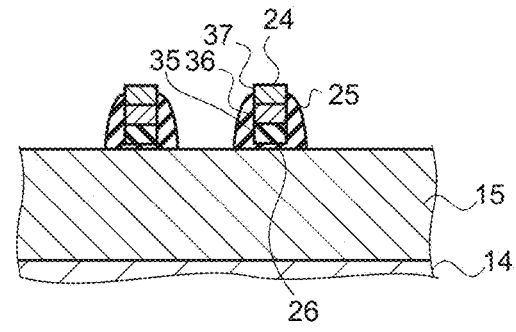
FIG. 5C
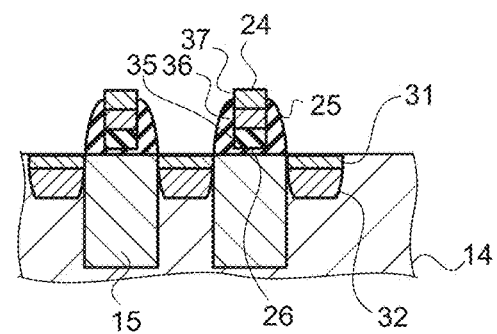

FIG. 7A
FIG. 7D
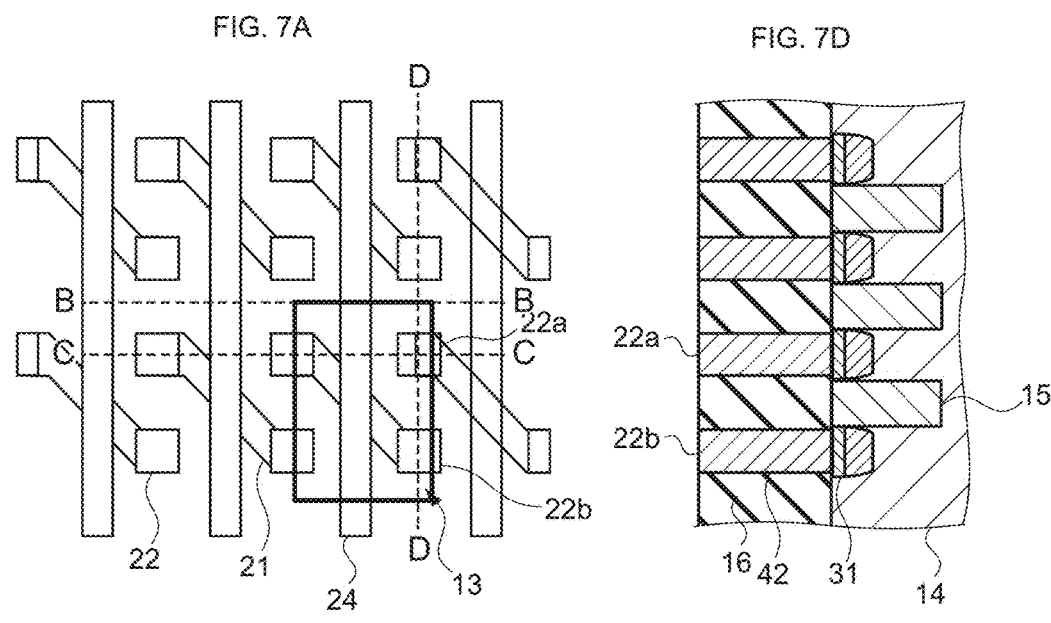
FIG. 7B
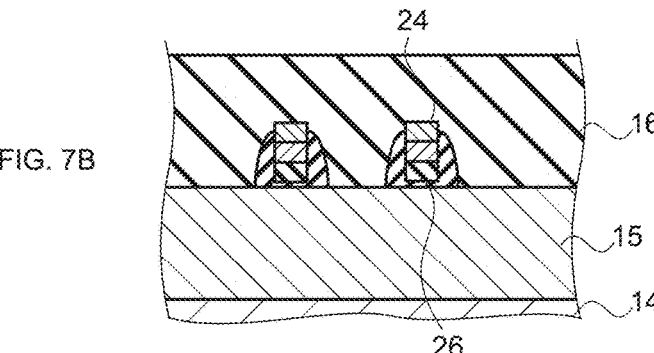
FIG. 7C
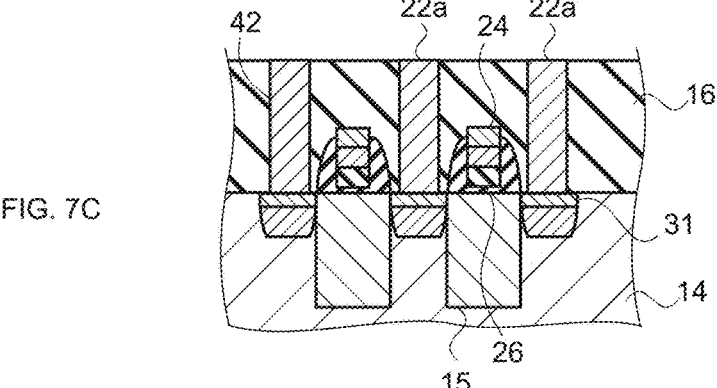

FIG. 8A
FIG. 8D
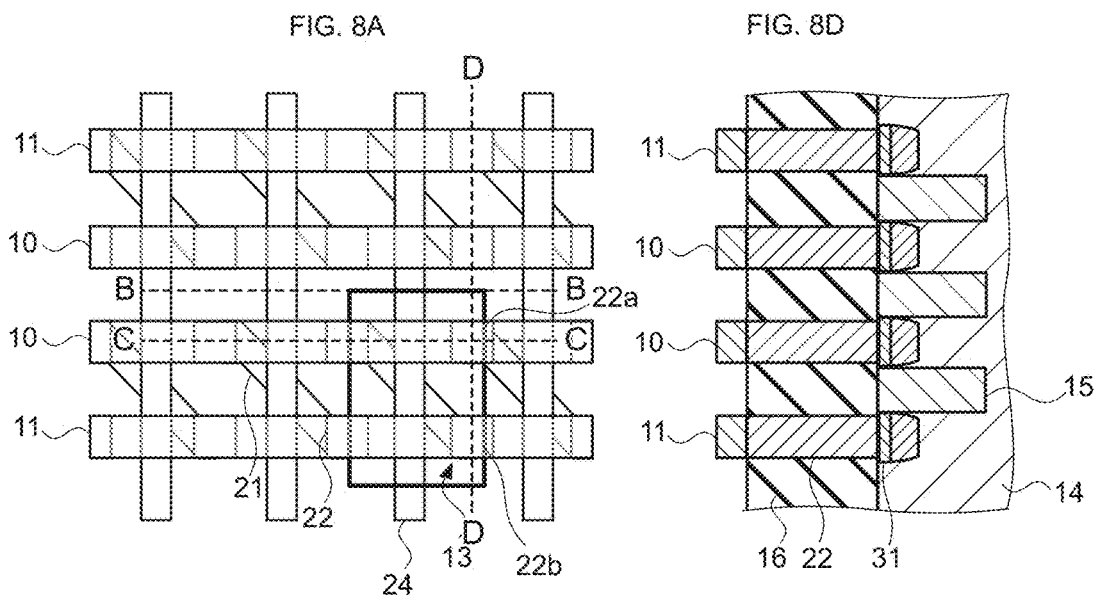
FIG. 8B
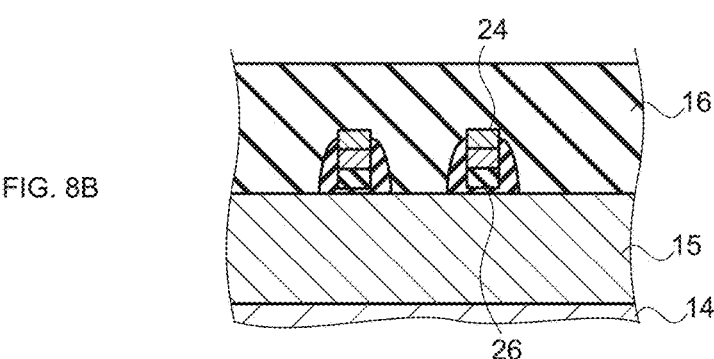
FIG. 8C
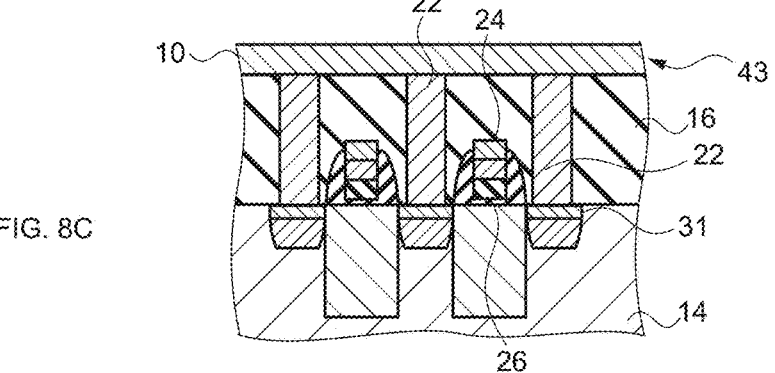

| | SWL | SBL | SSL | Pwell | UWL | UBL | USL |
|---|---|---|---|---|---|---|---|
| Write"1" | Vw | 0V | 0V | 0V | 1/3Vw | 2/3Vw | 2/3Vw |
| Read | Vr1 | Vr2 | 0V | 0V | 0V | 0V | 0V |

FIG. 11
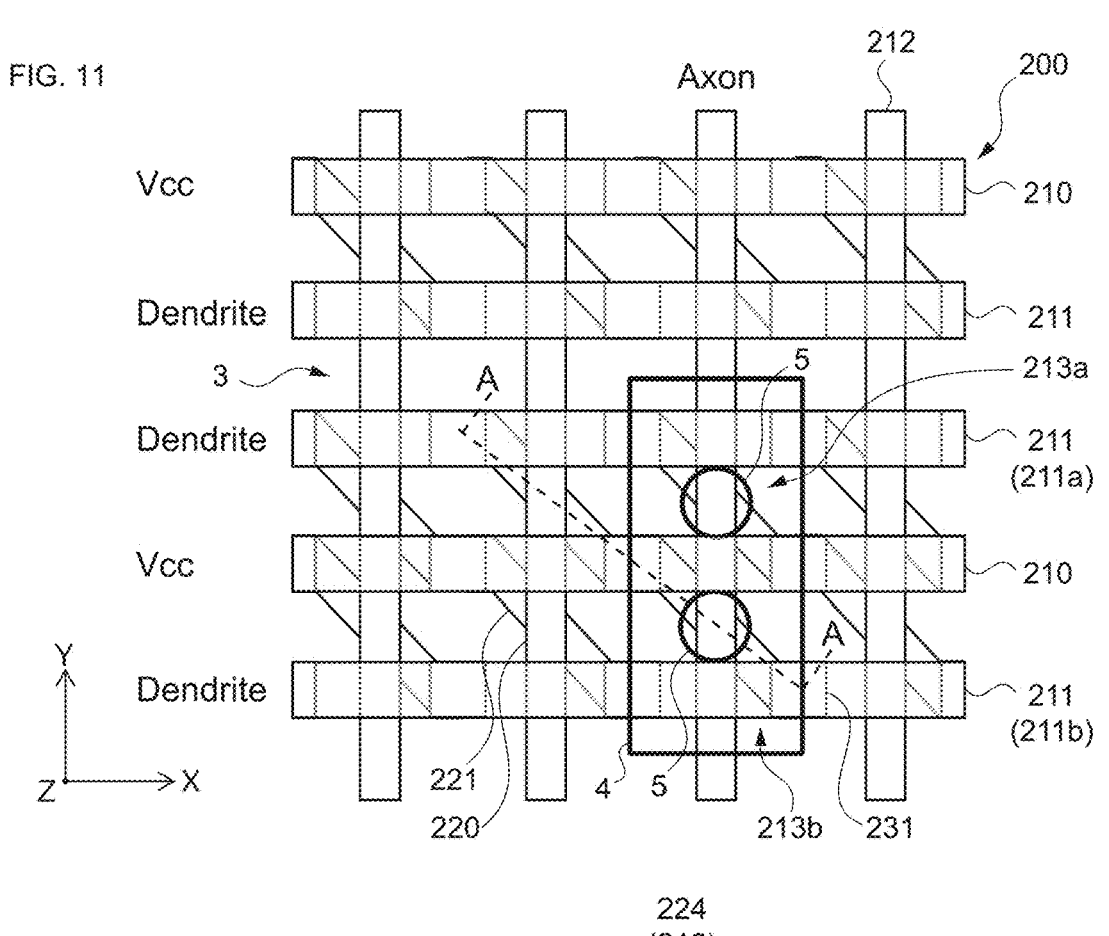
FIG. 12A
FIG. 12B
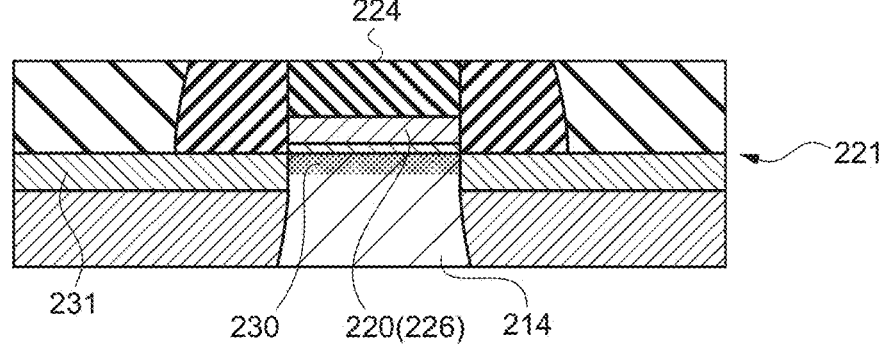

FIG. 13A
FIG. 13D
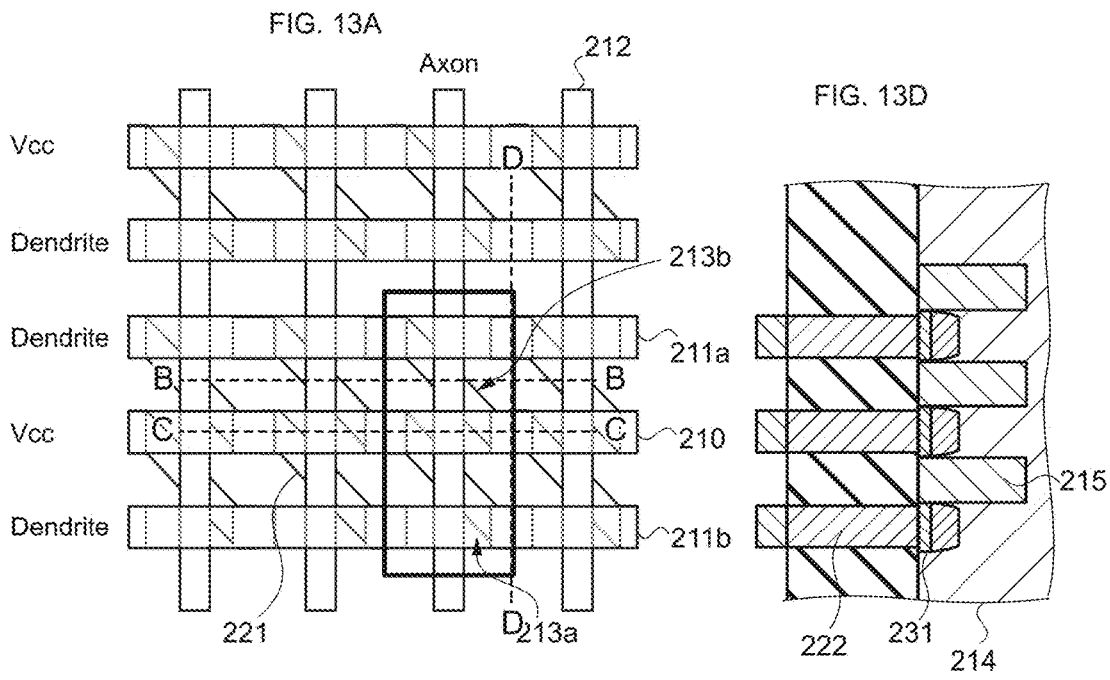
FIG. 13B
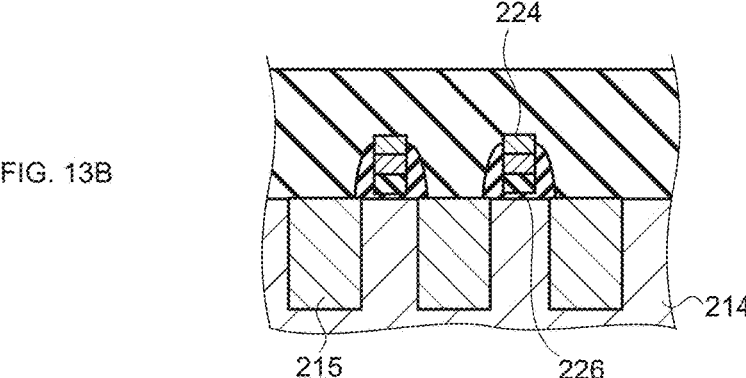
FIG. 13C
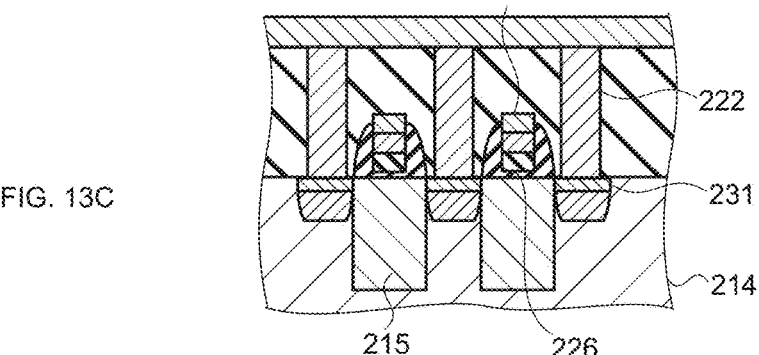

| | SWL | SBL | SSL | Pwell | UWL | UBL | USL |
|---|---|---|---|---|---|---|---|
| Write"1" | Vw | 0V | 0V | 0V | 1/3Vw | 2/3Vw | 2/3Vw |

| | Axon | Vcc | Dendrite | Pwell |
|---|---|---|---|---|
| MAC | Vr | Vcc | Sense | 0V |

FIG. 16A
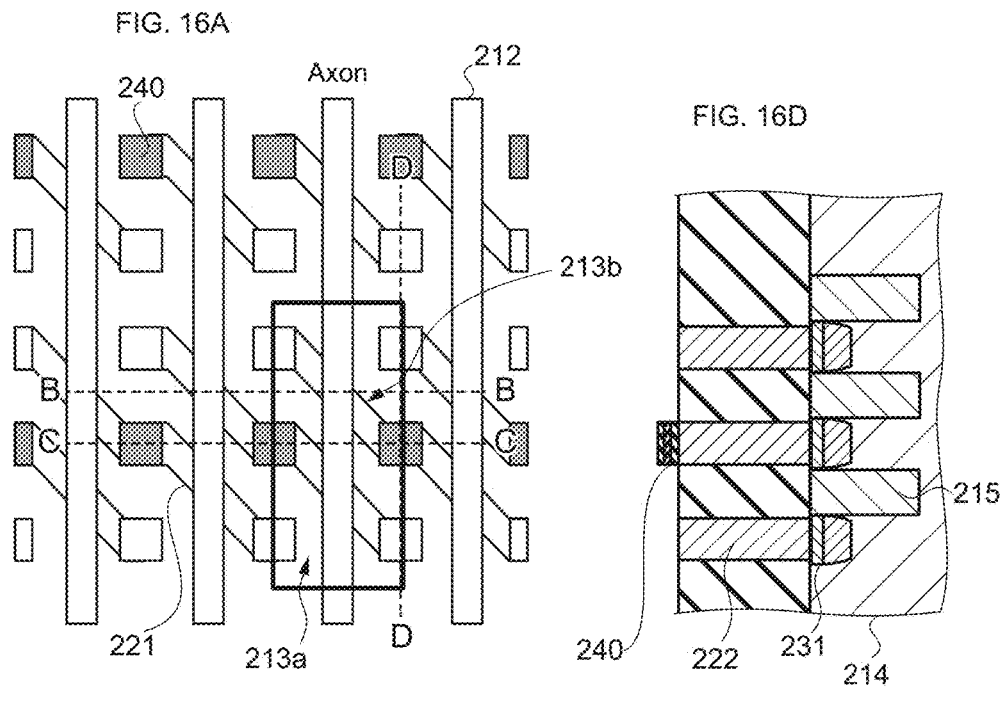
FIG. 16D
FIG. 16B
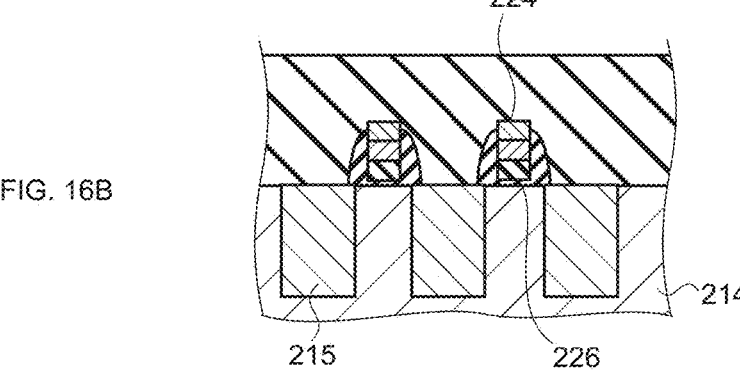
FIG. 16C
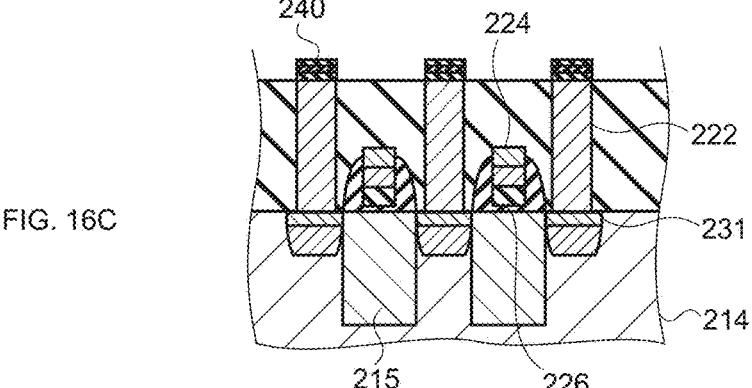

FIG. 17A
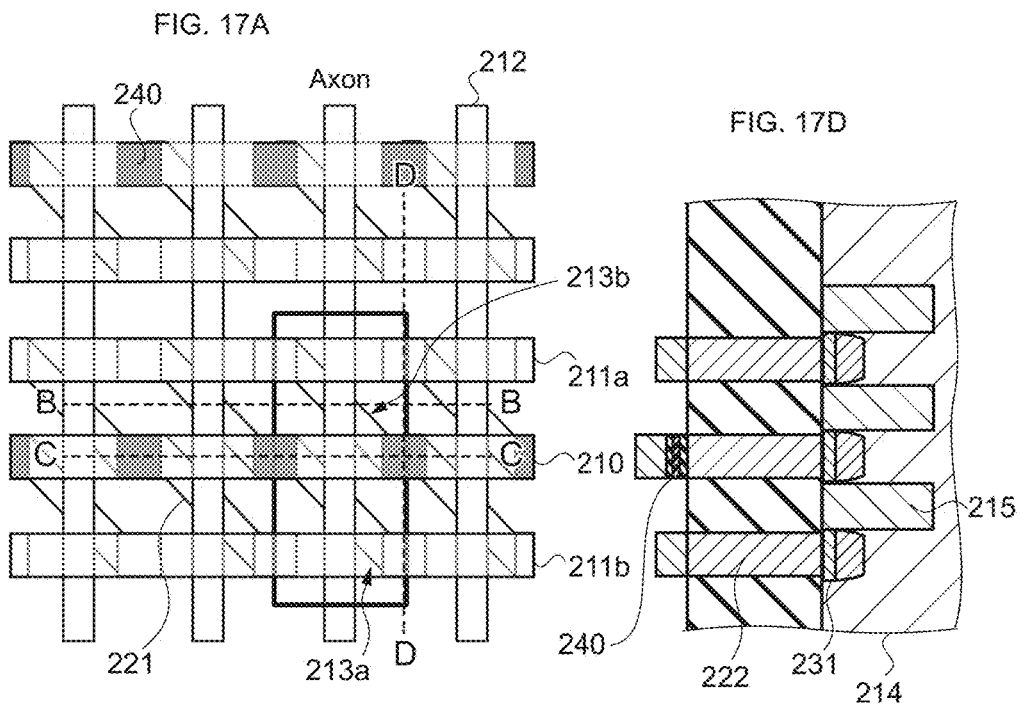
FIG. 17D
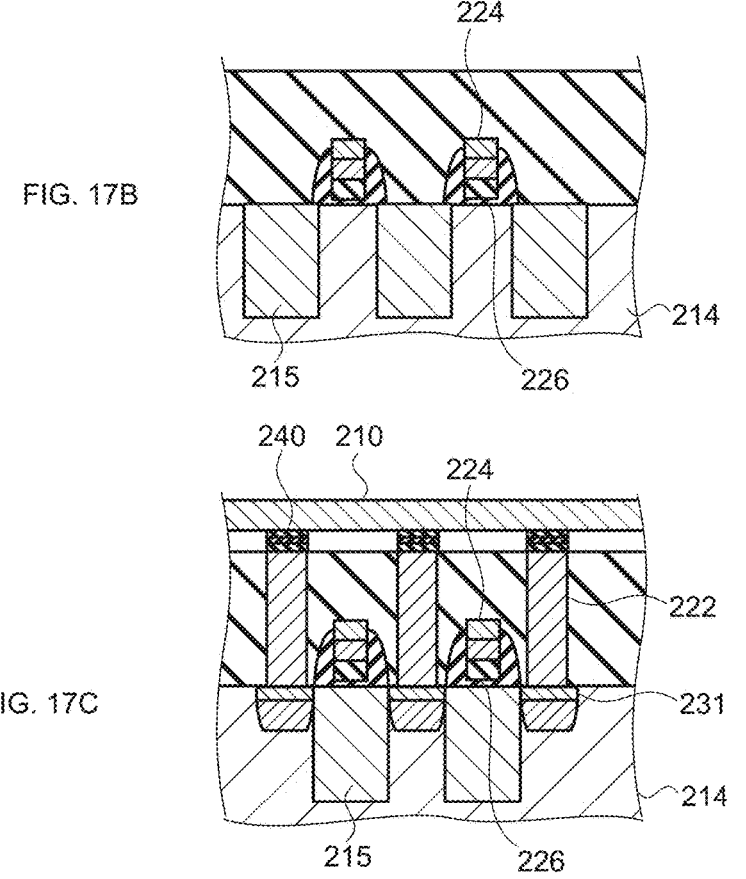
FIG. 17B
FIG. 17C

SEMICONDUCTOR DEVICE, NONVOLATILE STORAGE APPARATUS, MULTIPLY-ACCUMULATE OPERATION APPARATUS, AND MANUFACTURING METHOD FOR A SEMICONDUCTOR DEVICE

CROSS REFERENCE TO RELATED APPLICATIONS

This application is a U.S. National Phase of International Patent Application No. PCT/JP2020/029696 filed on Aug. 3, 2020, which claims priority benefit of Japanese Patent Application No. JP 2019-156016 filed in the Japan Patent Office on Aug. 28, 2019. Each of the above-referenced applications is hereby incorporated herein by reference in its entirety.

TECHNICAL FIELD

The present technology relates to a semiconductor device with a nonvolatile memory function, a nonvolatile storage apparatus, a multiply-accumulate operation apparatus, and a manufacturing method for a semiconductor device.

BACKGROUND ART

Conventionally, devices with a nonvolatile memory function have been developed. In a MOSFET-type device, a drain current and the like of each cell are controlled in accordance with a state recorded for each cell. Such a device is utilized as a storage apparatus that stores data. Also, arithmetic apparatuses using devices with a memory function have been developed in recent years.

For example, Non-Patent Literature 1 has described a MOSFET-type arithmetic circuit including floating gates. This arithmetic circuit includes a plurality of memory cells designed on the basis of a NOR-type flash memory. Each memory cell stores a pre-set weight value and outputs a signal representing a product value of an input value, which is input as an analog signal, and the weight value. Moreover, in the arithmetic circuit, a neuromorphic network that calculates a sum of these product values is configured and arithmetic processing such as machine learning is performed.

CITATION LIST

Non-Patent Literature

Non-Patent Literature 1: X. Guo1 et al., "Fast, Energy-Efficient, Robust, and Reproducible Mixed-Signal Neuromorphic Classifier Based on Embedded NOR Flash Memory Technology" 2017 IEEE International Electron Devices Meeting (IEDM), 2017, p. 151-154.

DISCLOSURE OF INVENTION

Technical Problem

As described above, a storage apparatus, an arithmetic apparatus, or the like can be configured by the use of devices with the nonvolatile memory function, and the devices with the nonvolatile memory function are expected to be applied in various fields. It is thus desirable to provide a technology that can increase the reliability of the devices with the nonvolatile memory function and achieve shrinking of the devices with the nonvolatile memory function.

In view of the above-mentioned circumstances, it is an object of the present technology to provide a semiconductor device, a nonvolatile storage apparatus, a multiply-accumulate operation apparatus, and a manufacturing method for a semiconductor device that can increase the reliability of a device with a nonvolatile memory function and achieve shrinking of the device with the nonvolatile memory function.

Solution to Problem

In order to accomplish the above-mentioned object, a semiconductor device according to an embodiment of the present technology includes a plurality of first wires, a plurality of second wires, a plurality of third wires, and a plurality of memory units.

The plurality of first wires is arranged to be parallel to each other.

The plurality of second wires is arranged to be parallel and adjacent to the plurality of first wires, respectively.

The plurality of third wires is arranged to be orthogonal to the first wires and the second wires.

The plurality of memory units each has a nonvolatile memory layer that maintains a state set via the third wire, and an active layer that is arranged obliquely to the third wire and electrically connects the first wire and the second wire adjacent to each other in accordance with the state of the memory layer and is a MOSFET-type.

This semiconductor device includes the first, second, and third wires and the MOSFET-type memory unit having the nonvolatile memory layer and the active layer. Since the third wire that sets the state of the memory layer is arranged to be orthogonal to the first and second wires, a situation where memory layers other than a target memory layer are rewritten is avoided. Moreover, since the active layer is arranged obliquely to the third wire, adjacent memory units can be arranged to be closer to each other. Accordingly, it is possible to increase the reliability of a device with a nonvolatile memory function and achieve shrinking of the device with the nonvolatile memory function.

The memory layer may be a gate dielectric film including ferroelectrics.

The memory unit may be an nMOSFET-type device.

The memory unit may include a first electrode portion that connects the active layer to the first wire, a second electrode portion that connects the active layer to the second wire, and a third electrode portion that is connected to the third wire and controls the state of the memory layer.

The first electrode portion and the second electrode portion may be arranged sandwiching the third wire.

The first wire may be a source line. In this case, the second wire may be a bit line. Moreover, the third wire may be a word line. Moreover, each of the plurality of memory units may be a nonvolatile memory cell that outputs a state stored in the memory layer by being selected through the word line and the bit line.

The source line and the bit line may form one wire pair and be arranged such that arrangement relationships between the source lines and the bit lines in the wire pairs adjacent to each other are inverted.

The source line and the bit line may form one wire pair and be arranged such that arrangement relationships between the source lines and the bit lines in the wire pairs adjacent to each other are same.

The first wire may be a driving line for supplying a driving voltage. In this case, the second wire may be an output line. Moreover, the third wire may be an input line into which an input signal representing an input value is input. Moreover, each of the plurality of memory units may be a multiplication cell that generates an electric charge corresponding to a product value obtained by multiplying a weight value corresponding to the state of the memory layer by the input value, and configure a multiply-accumulate operation apparatus by outputting an electric charge corresponding to the product value to the output line that is common.

The output line may include a first output line and a second output line arranged on both sides of the driving line. In this case, the multiply-accumulate operation apparatus may be constituted by a pair of the multiplication cells including a first multiplication cell connected to the input line and the first output line and a second multiplication cell connected to the input line, which is common to the first multiplication cell, and the second output line.

The driving voltage may be a voltage higher than a voltage of the output line. The multiplication cell may be an nMOSFET-type device and include a high-resistance element arranged between the active layer and the driving line.

The high-resistance element may be a resistance element having a resistance value of 1 MΩ or more.

The semiconductor device may further include an isolation region that is provided in a direction in which the first wires and the second wires extend, the memory unit being not formed in the isolation region. In this case, the memory units adjacent to each other along the third wire may be isolated through the isolation region.

The memory units adjacent to each other along the third wire may be connected to the second wire that is common.

A write voltage may be applied on the memory layer of the memory unit of the plurality of memory units, which is a writing target, and a voltage that is one third of the write voltage or a voltage that is two thirds of the write voltage may be applied on the memory layer of the other memory unit that is not the writing target.

A nonvolatile storage apparatus according to an embodiment of the present technology includes a plurality of source lines, a plurality of bit lines, a plurality of word lines, and a plurality of memory cells.

The plurality of source lines is arranged to be parallel to each other.

The plurality of bit lines is arranged to be parallel and adjacent to the plurality of source lines, respectively.

The plurality of word lines is arranged to be orthogonal to the source lines and the bit lines.

The plurality of MOSFET-type memory cells each has a nonvolatile memory layer that maintains a state set via the word line, and an active layer that is arranged obliquely to the word line and electrically connects the source line and the bit line adjacent to each other in accordance with the state of the memory layer and is a MOSFET-type.

A multiply-accumulate operation apparatus according to an embodiment of the present technology includes a plurality of driving lines, a plurality of output lines, a plurality of input lines, and a plurality of multiplication cells.

The plurality of driving lines is arranged to be parallel to each other.

The plurality of output lines is arranged to be parallel and adjacent to each of the plurality of driving lines, respectively.

The plurality of input lines is arranged to be orthogonal to the driving lines and the output lines.

The plurality of MOSFET-type multiplication cells each has a nonvolatile memory layer that maintains a state set via the input line, and an active layer that is arranged obliquely to the input line and electrically connects the driving line and the output line adjacent to each other in accordance with the state of the memory layer and is a MOSFET-type.

An input signal representing an input value may be input into each of the plurality of input lines. In this case, each of the plurality of multiplication cells may generate an electric charge corresponding to a product value obtained by multiplying a weight value corresponding to the state of the memory layer by the input value and output the electric charge to the output line. Moreover, the multiply-accumulate operation apparatus may further include a plurality of output units that each outputs, on the basis of the electric charge output to the output line by a group of the multiplication cells connected to the output line that is common, a multiply-accumulate signal representing a sum of the product values in the group of the multiplication cells.

A plurality of multiply-accumulate units each including the group of the multiplication cells and the output unit and capable of outputting the multiply-accumulate signal may be connected in parallel to the plurality of input lines.

A manufacturing method for a semiconductor device according to an embodiment of the present technology is a manufacturing method for a semiconductor device including a plurality of first wires arranged to be parallel to each other, a plurality of second wires arranged to be parallel and adjacent to the plurality of first wires, respectively, a plurality of third wires arranged to be orthogonal to the first wires and the second wires, and a plurality of MOSFET-type memory units, including:

in a manufacturing process for the memory units, forming active layers that electrically connect the first wires and the second wires adjacent to each other in accordance with states of memory layers, obliquely to the third wires; and forming the memory layers that maintain the states set via the third wires and are nonvolatile.

BRIEF DESCRIPTION OF DRAWINGS

FIG. 1 A schematic diagram showing a configuration example of a nonvolatile storage apparatus according to a first embodiment of the present technology.

FIGS. 2A and 2B A schematic diagrams showing a configuration example of a cross-section of a device structure of the nonvolatile storage apparatus.

FIGS. 5A, 5B, 5C and 5D A plan view and cross-sectional views showing each step of the manufacturing method for the nonvolatile storage apparatus.

FIGS. 7A, 7B, 7C and 7D A plan view and cross-sectional views showing each step of the manufacturing method for the nonvolatile storage apparatus.

FIGS. 8A, 8B, 8C and 8D A plan view and cross-sectional views showing each step of the manufacturing method for the nonvolatile storage apparatus.

FIG. 11 A schematic diagram showing a configuration example of the multiply-accumulate operation apparatus.

FIGS. 12A and 12B A schematic diagrams showing a configuration example of a cross-section of a device structure of the multiply-accumulate operation apparatus.

FIGS. 13A, 13B, 13C and 13D A schematic diagrams showing a configuration example of another cross-section of the device structure of the multiply-accumulate operation apparatus.

FIGS. 16A, 16B, 16C and 16D A plan view and cross-sectional views showing each step of a manufacturing method for the multiply-accumulate operation apparatus shown in FIGS. 15A and 15B.

FIGS. 17A, 17B, 17C and 17DA plan view and cross-sectional views showing each step of the manufacturing method for the multiply-accumulate operation apparatus shown in FIGS. 15A and 15B.

MODE(S) FOR CARRYING OUT THE INVENTION

Figure 3A:
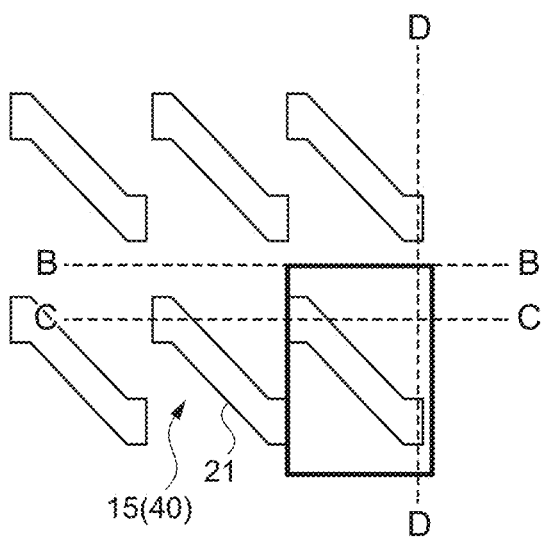
FIGS. 3A, 3B, 3C and 3D A plan view and cross-sectional views showing each step of a manufacturing method for the nonvolatile storage apparatus.
Figure 3D:
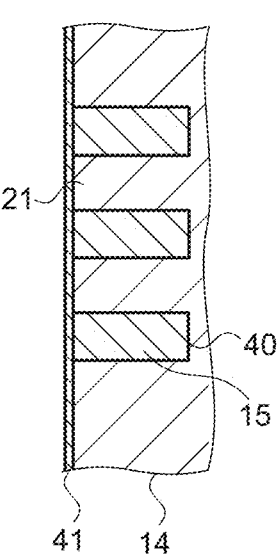

Hereinafter, embodiments according to the present technology will be described with reference to the drawings.

First Embodiment

[Configuration of Nonvolatile Storage Apparatus]

FIG. 1 is a schematic diagram showing a configuration example of a nonvolatile storage apparatus according to a first embodiment of the present technology. A nonvolatile storage apparatus 100 is a nonvolatile semiconductor memory capable of maintaining recorded data also in a powered-off state. In this embodiment, the nonvolatile storage apparatus 100 corresponds to a semiconductor device. In the present disclosure, the semiconductor device refers to, for example, an integrated device with a plurality of devices integrated on a semiconductor substrate. In FIG. 1, a see-through plan view of the nonvolatile storage apparatus 100 integrated on a semiconductor substrate is schematically shown.

The nonvolatile storage apparatus 100 includes a plurality of source lines 10, a plurality of bit lines 11, a plurality of word lines 12, and a plurality of memory cells 13. One source line 10, one bit line 11, and one word line 12 are connected to each memory cell 13. For example, 1-bit data representing 0 and 1 is recorded in each memory cell 13. It should be noted that a multi-value method of storing data of one or more bits may be used. First of all, the arrangement of the respective wires (source lines 10, bit lines 11, and word lines 12) will be described.

The plurality of source lines 10 is arranged to be parallel to each other. The source line 10 is a wire for supplying a source voltage to each memory cell 13. In FIG. 1, two source lines 10 (SL) arranged to be parallel to each other are schematically shown. In this embodiment, the source lines 10 correspond to first wires. Hereinafter, a direction in which the source lines 10 extend (left-and-right direction in the figure) will be referred to as an X direction. Moreover, a direction orthogonal to the X direction in the substrate plane will be referred to as a Y direction. Moreover, a depth direction orthogonal to the XY plane (substrate plane) will be referred to as a Z direction.

The plurality of bit lines 11 is arranged to be parallel and adjacent to the plurality of source lines 10, respectively. That is, each bit line 11 is arranged in the X direction adjacent to the corresponding source line 10. The bit line 11 is a wire used for selecting a memory cell 13 that is a target together with the word line 12 to be described later, and a signal corresponding to read data is output through the bit line 11. In this embodiment, one source line 10 and one bit line 11 form one wire pair. Therefore, the total number of source lines 10 is equal to the total number of bit lines 11. In FIG. 1, two bit lines 11 (BL) arranged to be parallel to each other are schematically shown. In this embodiment, the bit lines 11 correspond to second wires.

It should be noted that as will be described later, the source line 10 and the bit line 11 are wires arranged in a top layer in the see-through plan view shown in FIG. 1. Typically, the source line 10 and the bit line 11 are stacked at the same timing. In FIG. 1, portions that are arranged in a layer below the source line 10 and the bit line 11 and overlap with the respective wires are depicted as the gray lines.

The plurality of word lines 12 is arranged to be orthogonal to the source line 10 and the bit line 11. In the present disclosure, the state in which the wires are orthogonal refers to a state in which the wires are orthogonal in a planar view as viewed in the direction (Z direction) orthogonal to the substrate plane. The respective word lines 12 are arranged in the Y direction at positions deeper than the source line 10 and the bit line 11 and are orthogonal to the source line 10 and the bit line 11 in the planar view. The word line 12 is used for selecting a memory cell 13 that is a target together with the above-mentioned bit line 11. The word line 12 is, for example, a wire for supplying a control voltage for performing data writing or reading in/from a memory cell 13 that is a target. In FIG. 1, four word lines 12 (WL) arranged to be parallel to each other are schematically shown. In this embodiment, the word lines 12 correspond to third wires.

The plurality of memory cells 13 is MOSFET-type devices that store data by utilizing structures of metal oxide semiconductor field effect transistors (MOSFETs). As shown in FIG. 1, each memory cell 13 is provided for each of the plurality of word lines 12 in a region sandwiched by the source line 10 and the bit line 11 (wire pair) corresponding to each other. Therefore, a memory array in which the plurality of memory cells 13 is arranged in a grid form is configured in the nonvolatile storage apparatus 100. In FIG. 1, a region (hereinafter, referred to as cell region 1) occupied by a single memory cell 13 in the XY plane is depicted as a rectangular region with the thick and solid line. In this embodiment, the memory cell 13 corresponds to a memory unit. Each memory cell 13 includes memory layers 20 and active layers 21.

The memory layers 20 are arranged in a layer below the word lines 12. In FIG. 1, the memory layers 20 are arranged directly under the word lines 12 so as to overlap with the word lines 12. The memory layer 20 is a layer in which data is stored, and is configured by using a material that maintains a state corresponding to a data value. The nonvolatile memory layer 20 that maintains data also in a powered-off state is configured by using such a material. The word line 12 is used when setting data in the memory layer 20. More specifically, the state of the memory layer 20 changes and data setting (writing) is performed by setting the voltage of the word line 12 to take a predetermined value. In this manner, the memory layer 20 maintains the state set via the word line 12.

In this embodiment, a ferroelectric material is used for the memory layer 20. The ferroelectric material is a material that generates spontaneous polarization (remanent polarization) inside the material. For example, 1-bit data can be recorded through an orientation of the spontaneous polarization. In this embodiment, the nonvolatile memory layer 20 is constituted by the ferroelectric material as such. Thus, the nonvolatile storage apparatus 100 is a ferroelectric random access memory (FeRAM) that stores data by using ferroelectrics (memory layers 20). The specific configuration of the memory layer 20 will be described later in detail.

As will be described later, the memory cell 13 is a 1T-type FeRAM that controls the polarization of the ferroelectric material (memory layer 20) through an electric field between a gate and a substrate or between a gate and source-drain. Therefore, the memory cell 13 serves as a gain cell capable of amplifying, through the MOSFET, the signal amount that varies depending on the polarization. Accordingly, it is possible to accurately control the signal strength (orientation of polarization) depending on the recorded data, and for example, highly-accurate memory reading and the like can be achieved.

The active layers 21 are regions that contribute to MOS-FET conduction and are formed in a layer lower than the above-mentioned memory layers 20. The active layer 21 include a source region, a drain region, and a channel region. The source region is a region that serves as a MOSFET source and the drain region is a region that serves as a MOSFET drain. The channel region is a region in which a channel that connects the source region to the drain region is formed. Therefore, the active layer 21 is a layer in which the source region and the drain region are respectively formed at both ends of the channel region. Hereinafter, the source region and the drain region will be sometimes referred to as a contact region.

In this embodiment, the active layers 21 are arranged obliquely to the word lines 12. That is, the active layers 21 (channel regions) are formed in a direction (Y direction) parallel to at least the word lines 12 or a direction different from a direction (Y direction) orthogonal to the word lines 12. The active layers 21 of the respective memory cells 13 are typically arranged in an identical direction. In FIG. 1, the active layers 21 arranged obliquely intersecting with the word lines 12 from upper left to lower right in the figure are schematically shown. The angle of intersection of the active layer 21 with respect to the word line 12 and the like are not limited. The angle of intersection of the active layer 21 with respect to the word line 12 may be set as appropriate in accordance with, for example, design rules related to dimensions of respective portions such as widths of the respective wires and widths of device isolation layers to be described later.

Moreover, contact electrodes 22 are formed at both ends (contact regions) of the active layer 21. One contact region of the active layer 21 is connected to the source line 10 via the contact electrode 22 and the other contact region is connected to the bit line 11 via the contact electrode 22. Thus, the active layer 21 serves as a conduction path that connects the source line 10 to the bit line 11.

As shown in FIG. 1, in the configuration in which the active layer 21 is obliquely arranged, some regions of the active layer 21 (channel region) are arranged overlapping with the word line 12 and the memory layer 20. Thus, a structure in which the memory layer 20 is sandwiched by the active layer 21 and the word line 12 is realized in this region. In this embodiment, data is stored in the region in which the memory layer 20 and the active layer 21 intersect with each other in this manner. Hereinafter, the region in which the memory layer 20 and the active layer 21 intersect with each other will be referred to as a storage region 2. In FIG. 1, the storage region 2 is schematically shown as a circular region with the thick and solid line.

For example, when a writing voltage is applied between the word line 12 and the active layer 21, the state of the memory layer 20 (e.g., orientation of spontaneous polarization) in the storage region 2 is rewritten. Accordingly, desired data can be stored in each memory cell 13. Moreover, the resistance of the channel region of the active layer 21 varies depending on the state of the spontaneous polarization. For example, it is assumed that a reading voltage is set in each wire. In this case, an amount of carrier (current value) that flows between the source line 10 and the word line 12 varies depending on the state of the memory layer 20. In this manner, the active layer 21 provides conduction between the source line 10 and the bit line 11 in accordance with the state of the memory layer 20. The current value corresponding to the data is read through a sense amplifier or the like (not shown) via the bit line 11, for example. Accordingly, the data stored in the memory layer 20 can be read.

In the nonvolatile storage apparatus 100, a memory cell 13 that is a data reading or writing target is selected by selecting the word line 12 and the bit line 11. That is, for selecting a certain memory cell 13, it is sufficient to select the word line 12 and the bit line 11 that are connected to the memory cell 13 and apply a reading voltage or writing voltage thereon. Thus, in this embodiment, the plurality of memory cells 13 each functions as a nonvolatile memory cell that is selected through the word line 12 and the bit line 11 to thereby output the state stored in the memory layer 20.

As described above, in this embodiment, the active layers 21 are arranged obliquely to the word lines 12. Therefore, the intervals of the memory cells 13 arranged along the bit lines 11 (source lines 10) can be reduced.

For example, in FIG. 1, a position in the X direction at which a certain active layer 21 connects to the source line 10 is the same as a position in the X direction at which an active layer 21 arranged on the left side of the certain active layer 21 connects to the bit line 11. Similarly, a position in the X direction at which a certain active layer 21 connects to the bit line 11 is the same as a position in the X direction at which an active layer 21 arranged the right side of the certain active layer 21 connects to the source line 10. Thus, the interval between the active layers 21 in the respective memory cells 13 adjacent to each other in the X direction can be reduced within such a range that the active layers 21 do not interfere with each other.

It should be noted that the sizes of the cell regions 1 in the Y direction are set in accordance with the design rules that defines the dimensions of the respective portions, for example. Thus, the sizes of the cell regions 1 in the Y direction are, for example, set to have approximately the same value (e.g., a minimum value under the design rules) irrespective of whether or not the active layers 21 are oblique or orthogonal to the word lines 12.

Since the active layers 21 are arranged obliquely to the word lines 12 in this embodiment as described above, the sizes of the active layers 21 in the X direction orthogonal to the word lines 12 can be greatly reduced, and the sizes of the cell regions 1 can be reduced. Accordingly, shrinking of the apparatus can be achieved. As a result, for example, it is possible to reduce the apparatus size and increase the density of the memory cells 13. Moreover, since an increase in area of the memory cells 13 can be prevented, the manufacturing costs can be reduced.

Moreover, as shown in FIG. 1, in this embodiment, an isolation region 3 is provided between the wire pairs (source lines 10 and bit lines 11) adjacent to each other. The isolation region 3 is a region which is provided in the direction (X direction) in which the source line 10 and the bit line 11 extend and in which the memory cells 13 (active layers) are not formed. Therefore, the memory cells 13 adjacent to each other along the word line 12 are isolated through the isolation region 3. Thus, for example, one wire pair is connected to each of a plurality of memory cells 13 arranged along one word line 12.

For example, a configuration to connect the memory cells 13 adjacent to each other along the word line 12 through a common source line 10 (bit line 11) is conceivable. In such a case, there is a possibility that a situation where a voltage applied for rewriting a selected memory cell is applied on an adjacent memory cell 13 via the common source line 10 (bit line 11) may occur, and a fault (write-disturb) in which the undesirable memory cell 13 is rewritten or the like may occur.

In this regard, in this embodiment, the memory cells 13 adjacent to each other along the word line 12 are isolated. Accordingly, it is possible to individually set a voltage to be applied on each memory cell 13. As a result, data reading, writing, and the like with respect to the memory cell 13 can be reliably performed, and highly-reliable operation control can be achieved.

Moreover, in this embodiment, the source lines 10 and the bit lines 11 are arranged such that the arrangement relationships between the source lines 10 and the bit lines 11 in the wire pairs adjacent to each other are inverted. In the example shown in FIG. 1, in the wire pair arranged on the upper side in the figure, the bit line 11 is arranged on the upper side and the source line 10 is arranged on the lower side. Moreover, in the wire pair arranged on the lower side in the figure, the source line 10 is arranged on the upper side and the bit line 11 is arranged on the lower side. In this manner, the adjacent wire pairs are arranged such that the source line 10 (or the bit line 11) of one pair and the source line 10 (or the bit line 11) of the other pair are adjacent to each other.

By arranging the source lines 10 and the bit lines 11 as pairs and making a lay-out in which the pairs are inverted in this manner, it is possible to configure a peripheral circuit such as a driver that drives the respective lines for each set of two adjacent source lines 10 or bit lines 11. For example, it is possible to form a circuit common to the source lines 10, a circuit common to the bit lines 11, and the like collectively for two lines. As a result, it is possible to efficiently lay out the peripheral circuit, and reduction of the lay-out area and the like can be achieved.

It should be noted that the arrangement relationship between the source line 10 and the bit line 11 in each wire pair may be identical. That is, the source line 10 and the bit line 11 may be arranged such that the arrangement relationships between the source lines 10 and the bit lines 11 included in the wire pairs adjacent to each other are the same. Also in such a case, each memory cell 13 can be appropriately driven.

[Cross-Sectional Structure of Nonvolatile Storage Apparatus]

FIGS. 2A and 2B are schematic diagrams showing a configuration example of a cross-section of a device structure of the nonvolatile storage apparatus 100. FIG. 2A is a schematic cross-sectional view of the nonvolatile storage apparatus 100 taken along the AA line shown in FIG. 1. The AA line is a line that cuts the active layer 21 and FIG. 2A is a cross-sectional view showing a basic structure of the memory cell 13. FIG. 2B is an enlarged view of a rectangular region with the dotted-line shown in FIG. 2A. Hereinafter, referring to FIGS. 2A and 2B, a laminate structure of the nonvolatile storage apparatus 100 will be described specifically.

As described above, the nonvolatile storage apparatus 100 includes the source lines 10, the bit lines 11, the word lines 12, and the memory cells 13. Moreover, the nonvolatile storage apparatus 100 further includes a semiconductor substrate 14, device isolation layers 15, and an inter-layer film 16.

The semiconductor substrate 14 is a substrate which is made from a semiconductor material and on which the memory cells 13 are formed. A silicon substrate, for example, is used as the semiconductor substrate 14. In addition, the specific configuration of the semiconductor substrate 14 is not limited. For example, a silicon on insulator (SOI) substrate with an insulating film of $SiO_2$ or the like sandwiched in the silicon substrate, or the like may be used. Moreover, a substrate formed from another elemental semiconductor of germanium or the like, a substrate formed from a compound semiconductor of gallium arsenic (GaAs), gallium nitride (GaN), silicon carbide (SiC), and the like, or the like may be used.

The device isolation layers 15 are formed with an insulative material and electrically isolate the respective memory cells 13 formed on the semiconductor substrate 14 from each other. The device isolation layers 15 are formed by, for example, embedding the device isolation layers 15 in the semiconductor substrate 14 such that the device isolation layers 15 can separate each of the obliquely arranged active layers 21. Moreover, regions isolated through the device isolation layers 15 are device regions in which the memory cells 13 are formed.

In the example shown in FIG. 2A, the device isolation layer 15 formed in the isolation region 3 described with reference to FIG. 1 is depicted. The device isolation layers 15 are formed as field oxide films with silicon oxide ($SiO_x$) or the like, for example. In addition, an insulative material such as silicon nitride ($SiN_x$) and silicon oxynitride (SiON) may be used for the device isolation layers 15.

The device isolation layers 15 are formed by, for example, a shallow trench isolation (STI) method. In this method, the device isolation layers 15 are formed by removing parts of the semiconductor substrate 14 in predetermined regions by etching or the like to form a trench structure and filling this trench structure with silicon oxide ($SiO_x$). Moreover, the device isolation layers 15 may be formed by a local oxidation of silicon (LOCOS) method. In this case, the device isolation layers 15 are formed by thermal oxidation of the semiconductor substrate 14 in the predetermined regions.

The memory cell 13 includes a memory layer 20, an active layer 21, contact electrodes 22, an interfacial layer 23, a gate electrode 24, and side walls 25. It should be noted that the gate electrode 24 functions as the word line 12. In FIG.

2A, a right structure including the word line 12 is the MOSFET structure of the memory cell 13. It should be noted that a left structure including the word line 12 is a cross-sectional structure of the word line 12 in the isolation region in which the active layer 21 is not provided.

In this embodiment, an nMOSFET-type device is formed as the memory cell 13. Thus, the regions isolated through the device isolation layers 15 are doped with p-type impurities (e.g., boron (B), aluminum (Al), or the like) as first conduction-type impurities. Thus, the device region is a P-well region in which a P-type well is formed.

As described above, the active layer 21 has a channel region 30 and contact regions 31 (source region or drain region) provided at both ends of the channel region 30. The channel region 30 is formed in a region of the semiconductor substrate 14, which is doped with p-type impurities. In FIG. 2B, the channel region 30 formed in the semiconductor substrate 14 is schematically shown as the hatched region. In this embodiment, the contact regions 31 are formed such that this channel region 30 is arranged obliquely to the word line 12. It should be noted that the contact region 31 functions as either one of the source region and the drain region in accordance with the voltage of the source line 10 or the bit line 11 and the like.

The contact regions 31 are second conduction-type regions formed in the semiconductor substrate 14. The contact regions 31 are doped with n-type impurities (e.g., phosphorus (P), arsenic (As), or the like) as second conduction-type impurities. In the example shown in FIG. 2A, n-type contact regions 31 are formed in a layer above NLDD regions 32. The NLDD regions 32 are lightly doped regions (regions into which impurities are to be injected) having a lower impurities concentration than that of the contact regions 31. The NLDD regions 32 are formed by being doped with the same n-type impurities as the contact regions 31. The contact regions 31 are formed by further doping regions after the NLDD regions 32 are formed with n-type impurities.

It should be noted that on surfaces of the contact regions 31, a high-melting-point metal such as Ni is stacked, and silicide layers (e.g., NiSi) are formed. The silicidization treatment is performed with a step of generating the gate electrode to be described later. By providing the silicide layers, it is possible to lower the contact resistance with the contact electrodes 22.

As shown in FIG. 2B, the interfacial layer 23 is provided on a surface of the semiconductor substrate 14 after the channel region 30 is formed. The interfacial layer 23 is a layer formed in a boundary between the memory layer 20 and the semiconductor substrate 14. The interfacial layer 23 is formed from an insulative material. For example, an oxide film (e.g., silicon oxide film) formed by oxidizing the surface of the semiconductor substrate 14 that is the channel region 30 is the interfacial layer 23.

The memory layer 20 is configured as a film made from a ferroelectric material. As shown in FIG. 2B, the memory layer 20 is formed in a layer above the interfacial layer 23. Moreover, the gate electrode 24 to be described later is formed in a layer above the memory layer 20. Thus, the memory layer 20 functions as a gate dielectric film arranged between the active layer 21 and the gate electrode 24. In this manner, the memory layer 20 is a gate dielectric film including ferroelectrics. For example, an electric field that acts on the active layer 21 (channel region 30) via the gate electrode 24 changes depending on the polarization of the memory layer 20 that is the gate dielectric film. Hereinafter, the memory layer 20 will be sometimes referred to as a ferroelectric film 26.

A ferroelectric material that generates spontaneous polarization the direction of which can be controlled by using an external electric field is used as the ferroelectric film 26. For example, an oxide-based ferroelectric material such as hafnium oxide ($HfO_x$), oxidized zirconium ($HfO_x$), and $HfZrO_x$ is used as such a material. Moreover, the ferroelectric film 26 may be formed by doping the film formed from the above-mentioned oxide-based ferroelectric material with chemical elements such as lanthanum (La), silicon (Si), and gadolinium (Gd). Alternatively, a perovskite-based ferroelectric material such as lead zirconate titanate (Pb(Zr, Ti) $O_3$: PZT) and strontium bismuth tantalate ($SrBi_2Ta_2O_9$: SBT) may be used. Moreover, the ferroelectric film 26 may have a single layer or may be formed with a plurality of layers.

The gate electrode 24 is formed in a layer above the ferroelectric film 26 (memory layer 20) and functions as the word line 12. The gate electrode 24 is an electrode common to the plurality of memory cells 13 arranged in the Y direction. As shown in FIG. 2A, the gate electrode 24 includes a metal electrode layer 35, a polysilicon layer 36, and a silicide layer 37. The gate electrode 24 serves as a wire of a laminate structure in which those layers are stacked. In this embodiment, the gate electrode 24 corresponds to a third electrode portion that is connected to the third wire and controls the state of the memory layer.

The metal electrode layer 35 is a metal electrode that is formed in a layer above the ferroelectric film 26 and is made from metal or alloy. For example, titanium nitride (TiN), tantalum nitride (TaN), or the like is used as the metal electrode layer 35. The polysilicon layer 36 is formed in a layer above the metal electrode layer 35. The silicide layer 37 is a layer that is formed in a layer above the polysilicon layer 36 and is obtained by stacking and silicidizing a high-melting-point metal on the polysilicon layer 36. For example, nickel (Ni) is used as the high-melting-point metal, and the silicide layer 37 is, for example, constituted by nickel silicide (NiSi). By configuring the gate electrode 24 in the laminate structure in this manner, it is possible to sufficiently lower the wiring resistance as compared to an electrode formed of a single polysilicon layer, for example.

The side walls 25 are side walls that are formed from an insulative material and provided on side surfaces of the gate electrode 24. The side walls 25 are, for example, formed by uniformly depositing an insulating film in a region including the gate electrode 24 and performing perpendicular anisotropic etching on the deposited insulating film. For example, silicon oxide ($SiO_x$), silicon nitride ($SiN_x$), silicon oxynitride (SiON), or the like is used as the side walls 25.

The side walls 25 shield the second conduction-type impurities doped in the contact regions 31 of the semiconductor substrate 14 and protect the channel region 30. The channel region 30 is formed directly under the gate electrode 24, and each contact region 31 (source region or drain region) is electrically connected via the channel region 30. In this manner, the side walls 25 set a positional relationship between each contact region 31 and the channel region 30 and the gate electrode 24.

The contact electrodes 22 are electrodes formed by filling through-holes (contact holes) provided penetrating the interlayer film 16. The contact electrodes 22 include a source contact 22a and a bit contact 22b. The source contact 22a is formed in a layer above the contact region 31 of one active layer of the active layers 21 and connects the active layer 21 to the source line 10. The bit contact 22b is formed in a layer above the contact region 31 of the other one active layer of the active layers 21 and connects the active layer 21 to the bit line 11. In this embodiment, the source contact 22a corresponds to a first electrode portion and the bit contact 22b corresponds to a second electrode portion.

In the example shown in FIG. 2A, the contact electrodes 22 are formed on the left side and the right side of the gate electrode 24, and serve as the source contact 22a and the bit contact 22b, respectively. That is, the source contact 22a and the bit contact 22b are arranged sandwiching the word line 12 (gate electrode 24). Accordingly, it is possible to connect the obliquely arranged active layer 21 to each of the source line 10 and the bit line 11 through the single contact electrode 22, and the lay-out and the manufacturing process can be simplified.

For example, a low resistance metal such as titanium (Ti) and tungsten (W) or a metal compound such as titanium nitride (TiN) and tantalum nitride (TaN) is used for the contact electrode 22 (source contact 22a and bit contact 22b). For example, the contact hole is filled with such an electrode material, such that the contact electrode 22 is formed. The contact electrode 22 may be formed of a single layer or may be formed as a laminate.

The inter-layer film 16 is formed from an insulative material, and is formed over the entire surface of the semiconductor substrate 14 so as to cover each memory cell 13 formed on the semiconductor substrate 14. A flattening treatment is performed on an upper layer of the inter-layer film 16 to form a flat surface. Moreover, the contact holes for forming the above-mentioned contact electrodes 22 are formed in the inter-layer film 16. A $SiO_2$ film is typically used as the inter-layer film 16. In addition, an insulative material such as silicon oxide ($SiO_x$), silicon nitride ($SiN_x$), and silicon oxynitride (SiON) may be used as the inter-layer film 16.

The source line 10 and the bit line 11 are constituted by a conductive material and are formed in a layer above the inter-layer film 16. The respective wires are arranged in the X direction so as to connect to the corresponding contact electrodes 22. For example, a wire material such as copper (Cu) and aluminum (Al) is used for the source line 10 and the bit line 11. For example, the source line 10 and the bit line 11 are formed in a layer above the inter-layer film 16, using a damascene structure of Cu or the like.

[Manufacturing Method for Nonvolatile Storage Apparatus]

Figure 3B:
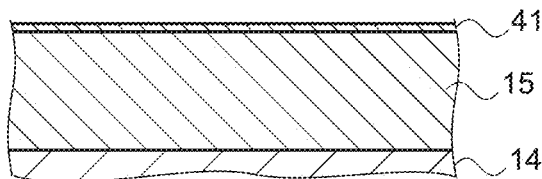
Figure 3C:
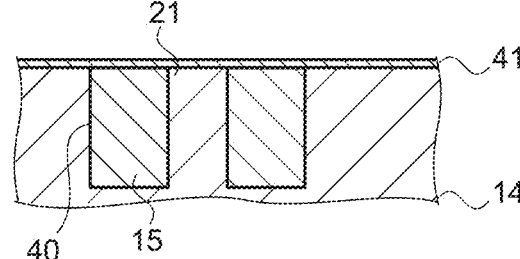
Figure 4A:
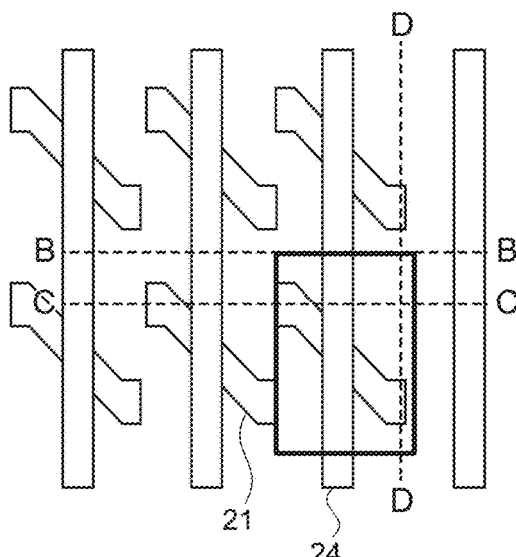
FIGS. 4A, 4B, 4C and 4D A plan view and cross-sectional views showing each step of the manufacturing method for the nonvolatile storage apparatus.
Figure 4D:
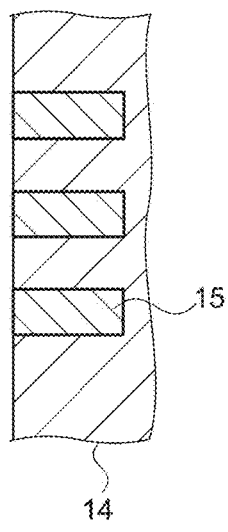
Figure 4B:
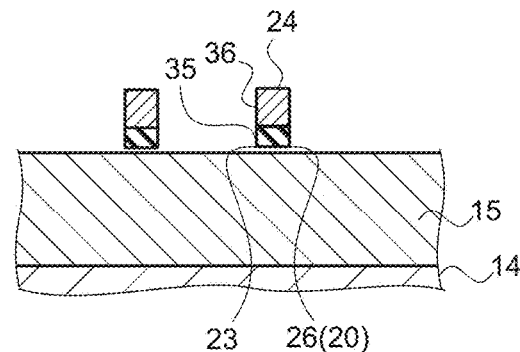
Figure 4C:
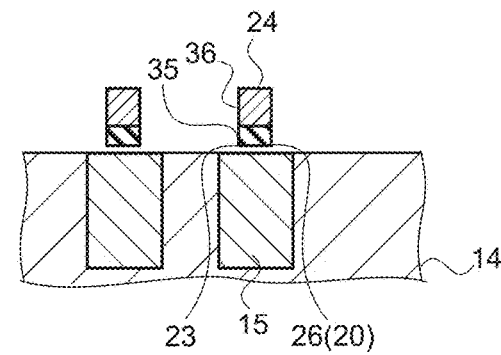
Figure 6A:
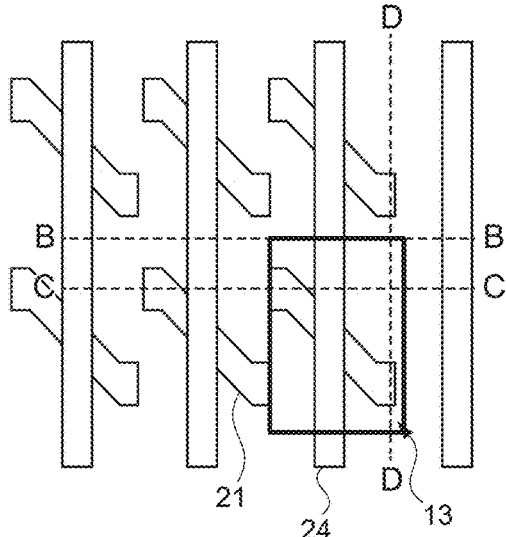
FIGS. 6A, 6B, 6C and 6D A plan view and cross-sectional views showing each step of the manufacturing method for the nonvolatile storage apparatus.
Figure 6D:
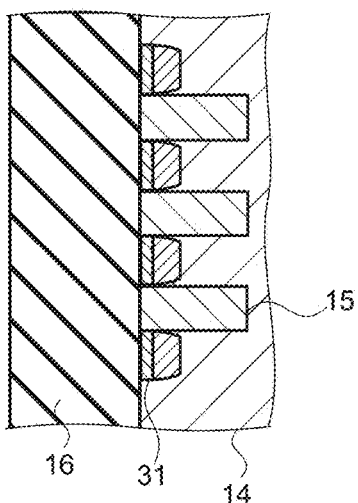
Figure 6B:
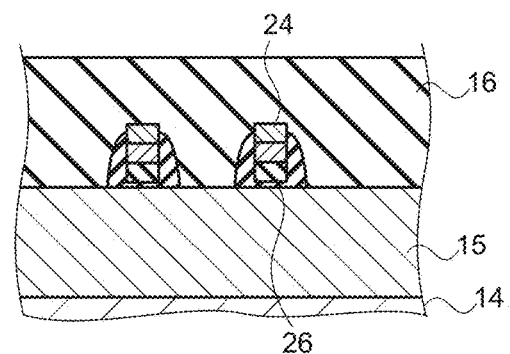
Figure 6C:
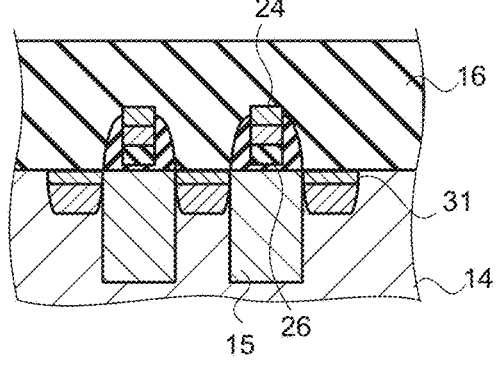

FIGS. 3A, 3B. 3C, 3D, 4A, 4B, 4C, 4D, 5A, 5B, 50, 5D, 6A, 6B, 6C, 6D, 7A, 7B, 7C, 7D, 8A, 8B, 8C and 8D are a plan view and cross-sectional views showing each step of the manufacturing method for the nonvolatile storage apparatus 100. Each of FIGS. 3A, 3B, 3C, 3D, 4A, 4B, 4C, 4D, 5A, 5B, 50, 5D, 6A, 6B, 6C, 6D, 7A, 7B, 70, 7D, 8A, 8B, 8C and 8D schematically shows a see-through plan view FIGS. 3A, 4A, 5A, 6A, 7A, 8A as the semiconductor substrate 14 (nonvolatile storage apparatus 100) is viewed in the Z direction, a cross-sectional view FIGS. 3B, 4B, 5B, 6B, 7B, 8B taken along the BB line depicted in the see-through plan view FIGS. 3A, 4A, 5A, 6A, 7A, 8A, a cross-sectional view FIGS. 3C, 4C, 50, 60, 70, 8C taken along the CC line, and a cross-sectional view FIGS. 3D, 4D, 5D, 6D, 7D, 8D taken along the DD line. Hereinafter, the manufacturing method for the nonvolatile storage apparatus 100 will be described with reference to FIGS. 3A, 3B, 3C, 3D, 4A, 4B, 4C, 4D, 5A, 5B, 5C, 5D, 6A, 6B, 6C, 6D, 7A, 7B, 7C, 7D, 8A, 8B, 8C and 8D.

FIGS. 3A, 3B, 3C and 3D shows a step of performing device isolation for isolating each memory cell 13. Specifically, the device isolation layers 15 are formed on the semiconductor substrate 14 and the device region of each memory cell 13 is formed. Here, the device isolation layers 15 are formed by the STI method. Moreover, the Si substrate is used as the semiconductor substrate 14.

FIG. 3 shows a step of performing device isolation for isolating each memory cell 13. Specifically, the device isolation layers 15 are formed on the semiconductor substrate 14 and the device region of each memory cell 13 is formed. Here, the device isolation layers 15 are formed by the STI method. Moreover, the Si substrate is used as the semiconductor substrate 14.

First of all, the $SiO_2$ film and the $Si_3N_4$ film are deposited on the semiconductor substrate 14 in the stated order. The $SiO_2$ film is, for example, formed by dry oxidation of the Si substrate. Moreover, the $Si_3N_4$ film is formed by chemical vapor deposition (CVD). Subsequently, resist patterning is performed on portions in which the active layers 21 are to be formed. The $Si_3N_4$ film/$SiO_2$ film/Si substrate are sequentially etched using such a pattern as a mask, such that groove-like trench regions 40 are formed. At this time, the semiconductor substrate 14 is etched with a depth of 350 to 400 nm, for example.

In FIG. 3A, obliquely formed patterns are regions (resist patterns) in which the active layers 21 are formed. Thus, regions outside the resist patterns are the trench regions 40. The trench regions 40 include field oxide films that are the device isolation layers 15. Moreover, pattern regions in which the Si3N4 films are left are the active layers 21. In this embodiment, the active layer 21 that provides conduction between the source line 10 and the bit line 11 in accordance with the state of the memory layer 20 is thus formed obliquely to the word line 12.

After the trench regions 40 are formed, the device isolation layers 15 are formed by embedding the $SiO_2$ film in the trench regions 40. For example, a dense film excellent in the step covering property can be formed by performing embedding using high-density plasma CVD. At this time, a stacked film thickness of the $SiO_2$ film is, for example, 650 to 700 nm. Subsequently, polishing is performed by a chemical mechanical polish (CMP) method, and the deposited $SiO_2$ film is flattened. At this time, in the pattern regions in which the $Si_3N_4$ films are left, polishing is performed by such a degree that the $SiO_2$ film on the $Si_3N_4$ film can be removed.

Subsequently, the $Si_3N_4$ films are removed with heat phosphoric acid, and the active layers 21 (active regions) are formed. It should be noted that the semiconductor substrate 14 may be annealed under an environment of $N_2$, $O_2$, or $H_2/O_2$ before the processing with heat phosphoric acid. The annealing treatment makes it possible to form the $SiO_2$ films of the device isolation layers 15 to be denser films, to perform rounding of making corner portions of the active layers 21 round, and the like.

Subsequently, a sacrificial oxide film 41 is formed by oxidizing the surfaces of the active layers 21. The film thickness of the sacrificial oxide film 41 is, for example, about 10 nm. After the sacrificial oxide film 41 is formed, ion implantation of the first conduction-type impurities (e.g., boron (B) or the like) is performed in regions in which MOSFETs (memory cells 13) are to be formed. Accordingly, the active layers 21 on the semiconductor substrate 14 (Si substrate) are transformed into first conduction-type well regions (P-well regions).

FIGS. 4A, 4B, 4C and 4D shows a step of forming a ferroelectric film 26, which is the memory layer 20, and the gate electrode 24. Specifically, films to be the ferroelectric film 26 and the gate electrode 24 are stacked over the entire surface of the semiconductor substrate 14, and this stacked film is shaped to conform to the pattern of the gate electrode 24.

First of all, the sacrificial oxide film 41 formed in FIGS. 3A, 3B, 3C and 3D are peeled off with a hydrogen fluoride (HF) solution. After that, the interfacial layer 23 is formed in the exposed Si substrate surface. The film thickness of the interfacial layer 23 is set to be approximately 0.5 to 1.5 nm. A rapid thermal oxidization (RTO) method, an oxygen plasma treatment, a chemical oxidation method using a treatment with a hydrogen peroxide-based solution, or the like is used for forming the interfacial layer 23.

Subsequently, the ferroelectric film 26 (memory layer 20) is stacked. For example, a hafnium oxide ($HfO_x$) film is used as the ferroelectric film 26. The film thickness of the $HfO_x$ film is, for example, set to approximately 3 to 10 nm. The $HfO_x$ film is formed by using, for example, a CVD method, an atomic layer deposition (ALD) method, or the like. Alternatively, the ferroelectric film 26 may be formed using $HfZrO_x$, PZT, SBT, or the like. Additionally, processing of doping the ferroelectric film 26 with a chemical element such as La may be performed.

Subsequently, the gate electrode 24 is stacked. First of all, titanium nitride (TiN) or tantalum nitride (TaN) is deposited as the metal electrode layer 35. The film thickness of the metal electrode layer 35 is, for example, set to approximately 5 to 20 nm. Sputtering, a CVD method, an ALD method, or the like can be used as a method of depositing the metal electrode layer 35.

Subsequently, the polysilicon layer 36 is stacked in a layer above the metal electrode layer 35. The film thickness of the polysilicon layer 36 is, for example, set to approximately 50 to 150 nm. The polysilicon layer 36 is deposited by a low-pressure CVD method using $SiH_4$ as a raw material gas, for example. The deposition temperature at this time is, for example, set to approximately 580 to 620°.

After the polysilicon layer 36 is deposited, a resist pattern of the gate electrode 24 is formed on the polysilicon layer 36 by lithography. Using this resist pattern as the mask, anisotropic etching using hydrogen bromide (HBr) or chlorine (Cl)-based gas is performed, and the polysilicon layer 36/metal electrode layer 35/ferroelectric film 26/interfacial layer 23 are etched in the stated order. Accordingly, the wiring pattern of the gate electrode 24 including the ferroelectric film 26 is formed. In this embodiment, the nonvolatile memory layer 20 that maintains the state set via the word line 12 (gate electrode 24) is thus formed.

FIGS. 5A, 5B, 5C and 5D shows a step of forming a ferroelectric FET (FeFET) including the ferroelectric film 26 as the memory layer 20. Specifically, the side walls 25 are formed on the side surfaces of the gate electrode 24 and the contact regions 31 are doped with the second conduction-type impurities (n-type impurities).

First of all, ion implantation of arsenic ions (As) that are the second conduction-type impurities is performed on both sides of the gate electrode 24 to thereby form the NLDD regions 32. At that time, the acceleration voltage is set to, for example, 5 keV to 20 keV approximately, and the concentration of ion implantation is set to, for example, 5 to $20 \times 10^{13}/cm^2$ approximately. By forming the NLDD regions 32, short-channel effects can be reduced and variations in the FET characteristics of the memory cells 13 and the like can be reduced. It should be noted that phosphorus (P) may be used as the second conduction-type impurities.

Subsequently, the side walls 25 are formed. First of all, a $SiO_2$ film is deposited with a film thickness of 10 to 30 nm by a plasma CVD method. After that, a $Si_3N_4$ film is deposited with a film thickness of 30 to 50 nm by a plasma CVD method. In this manner, insulating films for the side walls 25 are formed. Next, the deposited insulating films ($Si_3N_4$ film/$SiO_2$ film) is etched by anisotropic etching. In this manner, the side walls 25 are formed on the side surfaces of the gate electrode 24.

After the side walls 25 are formed, ion implantation of arsenic ions (As) that are the second conduction-type impurities is performed and contact regions 31 of n-type are formed on both sides of the gate electrode 24, respectively. At that time, the acceleration voltage is set to, for example, 20 keV to 50 keV approximately, and the concentration of ion implantation is set to, for example, 1 to $5 \times 10^{15}/cm^2$ approximately. In addition, impurities (dopant) subjected to ion implantation are activated by rapid thermal annealing (RTA) for 5 seconds at an annealing temperature of 1000° C. Accordingly, a MOSFET is formed. Moreover, in order to promote the activation of impurities and reduce the diffusion of impurities, the annealing treatment may be performed by spike RTA or the like.

Subsequently, a nickel (Ni) film is deposited on the entire surface of the semiconductor substrate 14 by sputtering or the like. The film thickness of the nickel film is set to, for example, 6 to 8 nm approximately. After the nickel film is deposited, Ni deposited on Si is silicidized by performing RTA for 10 to 60 seconds at an annealing temperature of 300 to 450° C. It should be noted that Ni deposited on $SiO_2$ of the field oxide films (device isolation layers write operation) and the like remains unreacted. The unreacted Ni film is removed by using $H_2SO_4/H_2O_2$ or the like, for example. As a result, the silicide layer 37 including nickel silicide (NiSi) having a low resistance is formed on the contact regions 31 and the gate electrode 24. In addition, $CoSi_2$, NiPtSi, or the like may be formed by depositing a Co film, a NiPt film, or the like instead of the Ni film. These silicides can be formed by setting the temperature and time of the RTA as appropriate, for example.

FIGS. 6A, 6B, 6C and 6D shows a step of forming an inter-layer film 16. Specifically, a stopper liner film (not shown) and the inter-layer film 16 are deposited in the stated order and the flattening treatment is performed thereon. It should be noted that the stopper liner film functions as a stopper that controls etching when forming contact holes 42 to be described later.

First of all, a stopper liner film is deposited on the entire surface of the semiconductor substrate 14. A silicon nitride (SiN) film is used as the stopper liner film, and the film thickness is set to 10 to 50 nm approximately. A plasma CVD method, a low-pressure CVD method, an ALD method, or the like is used for forming the stopper liner film. Moreover, the stopper liner film can also be formed as a layer that applies compression stress or tensile stress.

Subsequently, the inter-layer film 16 is deposited on the entire surface of the semiconductor substrate 14 by a CVD method. A $SiO_2$ film is used as the inter-layer film 16, and the film thickness is set to, for example, 100 to 500 nm approximately. After the inter-layer film 16 is deposited, and the upper layer of the inter-layer film 16 is flattened by CMP.

FIGS. 7A, 7B, 7C and 7D shows a step of forming contact electrodes 22. Specifically, contact holes 42 are formed in the inter-layer film 16, and the contact electrodes 22 are formed such that these contact holes 42 are embedded.

First of all, a plurality of contact holes 42 that penetrate the inter-layer film 16 is formed. The contact holes 42 are formed to connect to the contact regions 31 of the active layers 21. A contact hole 42 (not shown) that connects to the gate electrode 24 is also formed. The contact holes 42 are formed by etching the inter-layer film 16. At this time, the SiO$_2$ film is selectively etched under an etching condition that the selectivity of the SiO$_2$/SiN (inter-layer film 16/stopper liner film) is high. Accordingly, etching stops at the stopper liner film, and therefore it is possible to improve the controllability of etching up to the respective silicided portions (contact regions 31 and silicide layer 37).

After the contact holes 42 are formed, Ti and TiN are deposited by a CVD method or the like, W is further deposited, and the contact holes 42 are filled with electrode materials. After that, flattening by a CMP method is performed, and unnecessary electrode materials are removed. Accordingly, the contact electrodes 22 are formed. It should be noted that the contact electrodes 22 serve as W-plugs with tungsten exposed to the upper layer. It should be noted that Ti and TiN may be deposited by sputtering or the like using ion metal plasma (IMP) instead of the CVD method. Alternatively, flattening may be performed by front etching back instead of the CMP method.

These contact electrodes 22 function as the source contact 22$a$ and the bit contact 22$b$ in the memory cell 13. Moreover, the contact electrode 22 functions as a contact that connect the source electrode, the drain electrode, and the gate electrode with respective wires in the logic region.

FIGS. 8A, 8B, 8C and 8D shows a step of forming wires such as the source lines 10 and the bit lines 11. Specifically, the source lines 10 and the bit lines 11 are formed in the same wiring layer 43. This wiring layer 43 is also used as wires that constitute other peripheral circuits including a CMOS circuit and the like.

For example, the wire material of Cu or the like using a damascene structure is deposited and the patterns of the source lines 10 and the bit lines 11 are formed. The patterns of the source lines 10 and the bit lines 11 are arranged to connect to the respective contact electrodes 22. Moreover, wires of Al or the like can also be formed. After the source lines 10, and the bit lines 11, and the like are formed, the peripheral circuit and the CMOS circuit of the memory cell 13 are formed by stacking other wiring layers 43 (not shown) as needed and providing contacts that connect between the respective layers as appropriate.

In accordance with the above-mentioned steps, the nonvolatile storage apparatus 100 according to this embodiment can be formed. It should be noted that the above-mentioned materials, numerical values, and the like are exemplary, and may be modified as appropriate in accordance with configurations and the like of the apparatus.

[Basic Operation of Nonvolatile Storage Apparatus]

Figures 9A, 9B:
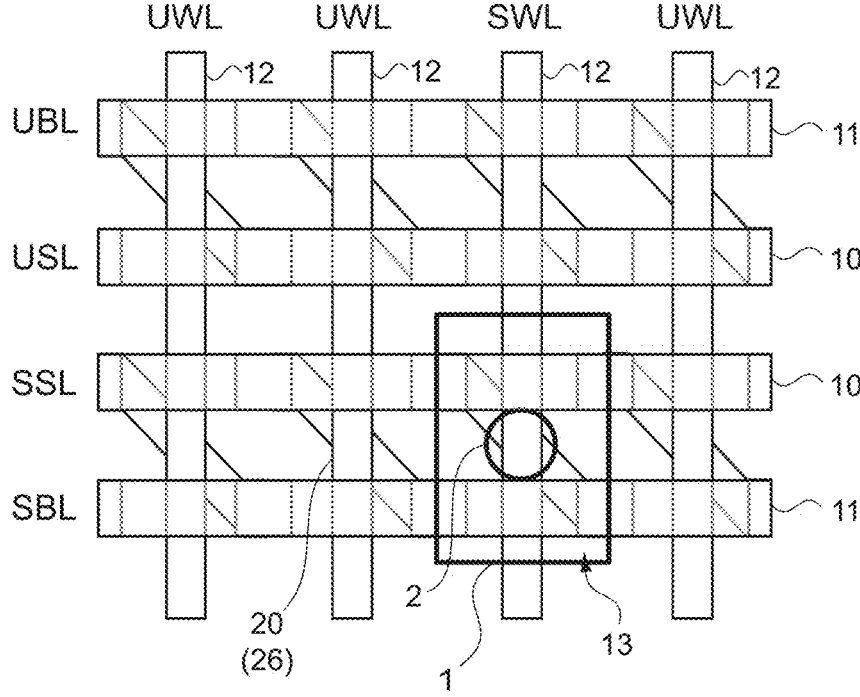
FIGS. 9A and 9B A diagrams for describing a write operation and a read operation in the nonvolatile storage apparatus.

FIGS. 9A and 9B is a are diagrams for describing a write operation and a read operation in the nonvolatile storage apparatus 100. FIG. 9A is a see-through plan view described with reference to FIG. 1 and represents a state in which the memory cell 13 is selected. FIG. 9B is a table showing an example of a voltage of each wire for performing writing and reading of data with respect to the memory cell 13.

Hereinafter, the memory cell 13 selected as a target of write and read operations will be referred to as a selected memory cell 13. Moreover, the source line 10, the bit line 11, and the word line 12 that are connected to the selected memory cell 13 will be referred to as a selected source line (SSL) 10, a selected bit line (SBL) 11, and a selected word line (SWL) 12, respectively. Moreover, other source lines 10, other bit lines 11, and other word lines 12 that are not connected to the selected memory cell 13 will be referred to as unselected source lines (USL) 10, unselected bit lines (UBL) 11, and unselected word lines (UWL) 12, respectively.

In FIG. 9A, the memory cell 13 that is arranged between the wire pair on the lower side and connects to the third word line 12 from the left is the selected memory cell 13. Thus, the source line 10 and the bit line 11 included in the wire pair on the lower side are the selected source line 10 and the selected bit line 11. Moreover, the third word line 12 from the left is the selected word line 12. On the other hand, the source line 10 and the bit line 11 included in the wire pair on the upper side are the unselected source line 10 and the unselected bit line 11. Moreover, the first, second, and fourth word lines 12 from the left are the unselected word lines 12.

First of all, an operation of writing data in the selected memory cell 13 will be described. As shown in FIG. 9B, in a case of writing data having a data value=1 (Write "1"), the selected word line 12 (SWL) is set to have a write voltage Vw. Here, Vw is a voltage also called program voltage and is a voltage necessary for polarizing the ferroelectric film 26 (FeFET) that is the memory layer 20. At that time, the voltage of the selected source line 10 (SSL) and the selected bit line (SBL) is set to zero. Moreover, the voltage of the P-well regions is set to zero. As a result, the write voltage Vw is applied on the ferroelectric film 26 and "1" is written as the data.

Moreover, in a case of writing data having a data value=1, the unselected word lines 12 (UWL) are set to have a voltage (⅓ Vw) that is ⅓ of the write voltage Vw. Moreover, the unselected source lines 10 (USL) and the unselected bit lines 11 (UBL) are set to have a voltage (⅔ Vw) that is ⅔ of the write voltage Vw. As a result, in the unselected memory cells 13, the voltage of ⅓ Vw is applied on the ferroelectric film 26 and the polarization is not generated.

As described above, in this embodiment, the write voltage Vw is applied on the memory layer 20 of the selected memory cell 13 of the plurality of memory cells 13, which is the writing target, and a voltage that is one third of the write voltage Vw is applied on the memory layers 20 of the other unselected memory cells 13 that are not the writing target. Accordingly, in the unselected memory cells 13, data writing does not occur and the write-disturb and the like can be avoided. Accordingly, a highly-reliable storage apparatus can be provided.

Next, an operation of reading data stored in the selected memory cell 13 will be described. As shown in FIG. 9B, in a case of reading (Read) the data of the selected memory cell 13, the selected word line 12 (SWL) is set to have a first read voltage Vr1. Moreover, the voltage of the selected source line (SSL) is set to zero and the voltage of the selected bit line (SBL) is set to be a second read voltage Vr2. It should be noted that the voltage of the P-well regions is set to zero.

Here, Vr1 and Vr2 are, for example, a gate voltage and a drain voltage that are set in such a range that it does not affect the polarization of the ferroelectric film 26. Vr1 and Vr2 are set to take a value (e.g., ⅓ Vw or less) sufficiently lower than the write voltage Vw. Accordingly, read-disturb in which the data changes at the time of reading and the like can be sufficiently avoided.

It should be noted that when reading the data of the selected memory cell 13, the voltage of the unselected source lines 10 (USL), the unselected bit lines 11 (UBL), and the unselected word lines 12 (UWL) is set to zero. Accordingly, in the unselected memory cells 13, drain current or the like corresponding to the data does not flow and the data is not read. Moreover, the first read voltage Vr1 is sufficiently lower than Vw, and therefore the read-disturb and the like do not occur in the other unselected memory cells 13 arranged along the selected word line 12. Accordingly, the data stored in each memory cell 13 can be appropriately read without causing the read-disturb and the like.

Hereinabove, the nonvolatile storage apparatus 100 according to this embodiment includes the source lines 10, the bit lines, and the word lines 12 and the MOSFET-type memory cells 13 having the nonvolatile memory layers 20 and the active layers 21. Since the word lines 12 on which the states of the memory layers 20 are set are arranged to be orthogonal to the source lines 10 and the bit lines 11, a situation where the memory layers 20 other than the memory layer 20 that is the target are rewritten is avoided. Moreover, since the active layers 21 are arranged obliquely to the word lines 12, adjacent memory cells 13 can be arranged to be closer to each other. Accordingly, it is possible to increase the reliability of a device with a nonvolatile memory function and achieve shrinking of the device with the nonvolatile memory function.

In recent years, various circuits that utilize devices with a nonvolatile memory function have been developed. CMOS circuits having nMOSFET and pMOSFET configured on an identical substrate can be exemplified. The CMOS circuits require lower power consumption. Also, the CMOS circuits can be easily shrunk and highly integrated and can perform high speed operations. Therefore, the CMOS circuits are widely used as many devices that constitute an LSI. In particular, the LSI having many functions mounted on a single chip in addition to analog circuits and memories are produced as so-called system on a chip (SoC). Static random access memories (SRAMs) have been sometimes used as memories for those products. In recent years, a variety of memories are mixed and mounted for the purpose of reducing the costs and power consumption.

For example, there is a method of mixing and mounting a dynamic random access memory (DRAM) instead of the SRAM. However, applications of the SRAM and the DRAM can be limited because the SRAM and the DRAM are volatile memories that lose data when they are powered off. On the other hand, nonvolatile FETs utilizing floating gates, ferroelectric memories (FeRAM) using ferroelectrics, resistive random access memories (ReRAMs) utilizing changes in resistance, and the like are nonvolatile memories that retain data even when they are powered off. Those memories can be not only mixed and mounted as the SoC but also utilized as a single memory chip.

By the way, the resistive random access memories are useful for shrinking and lower power consumption, but it is difficult to increase the resistance ratio of the high resistance (HRS) to the low resistance (LRS). Therefore, the dynamic range of the output from the resistance element is small and it may be difficult to ensure detection accuracy (reading margin) required for reading data appropriately.

Moreover, with the nonvolatile FETs utilizing floating gates, the dynamic range of the output can be increased by changing the channel resistance. Accordingly, a high resistance ratio of the HRS/LRS can be ensured. On the other hand, in a method of using a hot carrier or FN tunnel current for data writing and erasing like a NOR-type flash memory, it may be difficult to perform shrinking because a high voltage is required. Moreover, for example, with configuration in which the source lines are arranged in parallel to the word lines in a nonvolatile FET, there is a possibility that such a hot carrier or the like acts on a floating gate of an unselected cell and undesirable write-disturb or read-disturb may occur.

In this embodiment, the active layers 21 of the memory cells 13 are arranged obliquely to the word lines 12. Therefore, the distance between the adjacent memory cells 13 can be reduced, and the device area (cell region 1) per unit cell can be reduced. Accordingly, shrinking of the semiconductor storage apparatus can be achieved.

Moreover, the word lines 12 are arranged to be orthogonal to the bit lines 11 and the source lines 10. Accordingly, in a case of attempting to select a certain memory cell 13, the selected word line 12 and the selected bit line 11 (selected source line 10) are orthogonal to each other. Therefore, the write-disturb or read-disturb in which data of the other unselected memory cells 13 arranged along the selected word line 12 is rewritten during a write operation or read operation can be sufficiently avoided. Accordingly, it is possible to provide a highly-reliable storage device.

Moreover, in this embodiment, the MOSFET-type memory cells 13 (FeFET) having the ferroelectric films 26 as the memory layers 20 are used. As described with reference to FIGS. 9A and 9B and the like, the FeFET is a device that operates by voltage driving in which a predetermined voltage is applied on the ferroelectric film 26 at the time of data writing or reading. Therefore, as compared to the nonvolatile FET including the floating gate and the like, the wire and device sizes can be reduced. Accordingly, the sizes of the cell regions 1 can be reduced and shrinking can be achieved.

Moreover, with the MOSFET-type memory cells 13, the resistance ratio corresponding to the data value (resistance ratio of HRS/LRS) can be sufficiently increased. Accordingly, it is possible to enlarge the variation width (dynamic range) of the output of the memory cells 13, and the reading margin can be sufficiently ensured. Accordingly, individual data can be appropriately read, and the reliability of the device can be sufficiently improved.

Second Embodiment

A multiply-accumulate operation apparatus according to a second embodiment of the present technology will be described. In the following description, descriptions of portions similar to the configurations and actions of the nonvolatile storage apparatus 100 described in the above-mentioned embodiment will be omitted or simplified.

Figure 10:
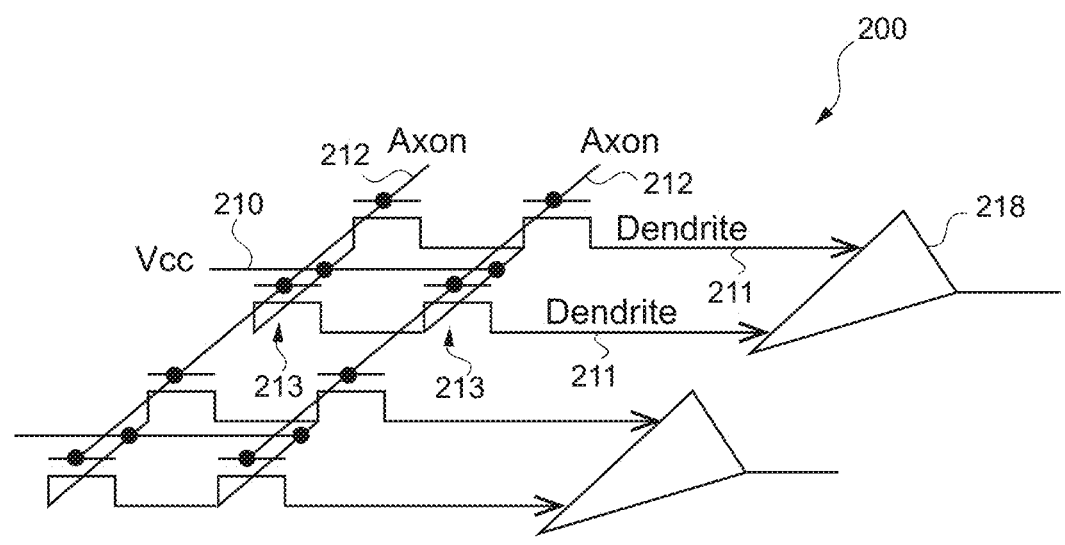
FIG. 10 A circuit diagram of a multiply-accumulate operation apparatus according to a second embodiment.

FIG. 10 is a circuit diagram of a multiply-accumulate operation apparatus 200 according to the second embodiment. In this embodiment, the multiply-accumulate operation apparatus 200 that utilizes a nonvolatile memory device will be described. The multiply-accumulate operation apparatus 200 is an analog arithmetic apparatus that performs predetermined arithmetic processing including a multiply-accumulate operation. The use of the multiply-accumulate operation apparatus 200 enables arithmetic processing according to a mathematical model such as a neural network, for example, to be performed. In this embodiment, the multiply-accumulate operation apparatus 200 corresponds to a semiconductor device.

Here, the multiply-accumulate operation is, for example, an arithmetic operation of adding up a plurality of product values obtained by multiplying a plurality of input values by weight values corresponding to respective input values, respectively. Therefore, it can also be said that the multiply-accumulate operation is processing of calculating a sum of the respective product values. Hereinafter, a basic circuit configuration of the multiply-accumulate operation apparatus 200 will be described with reference to FIG. 10.

The multiply-accumulate operation apparatus 200 includes a plurality of driving lines 210, a plurality of output lines 211, a plurality of input lines 212, a plurality of multiplication cells 213, and a plurality of output units 218.

For example, an arithmetic apparatus implementing a machine learning model such as a neural network is configured by configuring the multiply-accumulate operation apparatus 200 as appropriate. In FIG. 10, using neuroscience terms, the output line 211 will be referred to as Dendrite and the input line 212 will be referred to as Axon.

The driving line 210 is a wire for supplying each multiplication cell 213 with a driving voltage Vcc. The output line 211 is a wire for transmitting a signal output from each multiplication cell 213 to the output unit 218. The input line 212 is a wire into which an input signal representing an input value is input. Here, the input signal is, for example, an analog signal representing the input value with a pulse width or an input timing. In this embodiment, the driving lines 210 correspond to the first wires, the output lines 211 correspond to the second wires, and the output lines 211 correspond to the third wires.

The multiplication cell 213 outputs a signal corresponding to a product value obtained by multiplying the input value of the input signal input via the input line 212 by a prestored weight value. Thus, the signal output from the multiplication cell 213 is a signal representing a product value of the input value and the weight value. The signal representing the product value is transmitted to the output unit 218 via the output line 211. It should be noted that as shown in FIG. 10, the plurality of multiplication cells 213 is connected in parallel to one output line 211. In this embodiment, the multiplication cells 213 correspond to the memory units.

Specifically, the multiplication cell 213 is a MOSFET-type nonvolatile memory device. In this embodiment, a ferroelectric FET (FeFET) that stores data (weight value) in a ferroelectric film (memory layer) is used as the multiplication cell 213. Moreover, the multiplication cell 213 is configured as an nMOFET-type device. For example, the drain of the multiplication cell 213 is connected to the driving line 210 (Vcc), the source is connected to the output line 211 (Dendrite), and the gate is connected to the input line 212 (Axon). Moreover, the data representing the weight value is stored in the memory layer 220 of the multiplication cell 213.

For example, it is assumed that a signal having a pulse width corresponding to the input value is input as the input signal. In this case, the gate voltage is applied for a time corresponding to the input value in the multiplication cell 213 and a current (electric charge) corresponding to the weight value is output from the output line 211 during the time. Thus, the total amount of electric charge output from the multiplication cell 213 is a product value of the input value (time) and the weight value (current value). As described above, in this embodiment, the multiplication cell 213 generates an electric charge corresponding to the product value obtained by multiplying the weight value corresponding to the state of the memory layer 220 (ferroelectric film) by the input value and outputs the electric charge to the output line 211.

On the basis of an electric charge output to the output line 211 by a group of the multiplication cells 213 connected to the output line 211 that is common, the output unit 218 outputs a multiply-accumulate signal representing a sum of product values in the group of the multiplication cells 213. For example, in a case where the product value is represented by the amount of electric charge, the total amount of electric charge output by the respective connected multiplication cells 213 is detected and a multiply-accumulate signal representing the sum of the product values is generated on the basis of the total amount of electric charge. Accordingly, it is possible to perform a multiply-accumulate operation of calculating a sum of the plurality of product values. The specific configuration of the output unit 218 is not limited. For example, a circuit that accumulates electric charges in a capacitor or the like (not shown) and detects a voltage of the capacitor is used as the output unit 218.

As described above, in the multiply-accumulate operation apparatus 200, a plurality of multiply-accumulate units including the group of the multiplication cells 213 and the output unit 218 connected to the common output line 211 and capable of outputting a multiply-accumulate signal is configured. Those multiply-accumulate units are connected in parallel to the plurality of input lines 212 (Axon). Accordingly, it is possible to perform a plurality of multiply-accumulate operations at the same time with respect to a set of input values input from the respective input lines 212 and the arithmetic operation speed can be greatly improved. It should be noted that in the example shown in FIG. 10, a configuration in which each pair of output lines 211 is connected to each of the output units 218. In this case, each output line 211 functions as a positive output line 211 to which a signal (electric charge) representing a positive product value is output and a negative output line to which a signal (electric charge) representing a negative product value is output. Moreover, the output units 218 each calculate a sum of the positive product values and a sum of the negative product values, for example, and add up them to thereby calculate a total multiply-accumulate result. Accordingly, it is possible to correspond to positive and negative weight values and positive and negative input values.

As described above, the multiply-accumulate operation apparatus 200 is configured by each multiplication cell 213 outputting an electric charge corresponding to a product value to the common output line 211. For example, devices having a configuration similar to that of the memory cells 13 described with reference to FIG. 1 and the like can be used as such multiplication cells 213. Hereinafter, the lay-out of an integrated-circuit device that implements the multiply-accumulate operation apparatus 200 shown in FIG. 10 will be described.

FIG. 11 is a schematic diagram showing a configuration example of the multiply-accumulate operation apparatus 200. FIG. 12 is a schematic diagram showing a configuration example of a cross-section of the device structure of the multiply-accumulate operation apparatus 200. In FIG. 11, a see-through plan view of the multiply-accumulate operation apparatus 200 integrated on a semiconductor substrate is schematically shown. Moreover, FIG. 12A is a schematic cross-sectional view of the multiply-accumulate operation apparatus 200 taken along the AA line shown in FIG. 11. FIG. 12B is an enlarged view of a rectangular region with the dotted-line shown in FIG. 12A.

As shown in FIG. 11, in the multiply-accumulate operation apparatus 200, the plurality of driving lines 210 is arranged to be parallel to each other. Moreover, the plurality of output lines 211 is arranged to be parallel and adjacent to each of the plurality of driving lines 210. Moreover, the plurality of input lines 212 is arranged to be orthogonal to the driving line 210 and the output line 211. In this embodiment, the output lines 211 are respectively arranged on both sides of one driving line 210, and the one driving line 210 and the two output lines 211 on the both sides configure a set of three wires. In the multiply-accumulate operation apparatus 200, a plurality of sets of such wires is arranged to extend in the X direction. Hereinafter, the output line 211 arranged on the upper side with respect to the driving line 210 will be referred to as a first output line 211a and the output line 211 arranged on the lower side will be referred to as a second output line 211*b*. It should be noted that the isolation region 3 in which the multiplication cells 213 are not arranged is formed between sets of three wires.

The plurality of multiplication cells 213 is provided in regions sandwiched between the driving lines 210 and the output lines 211 that correspond to each other, for each of the plurality of input lines 212. For example, in a region at which the above-mentioned set of wires intersects with the input line 212, a multiplication cell 213 (first multiplication cell 213*a*) arranged between the driving line 210 and the first output line 211*a* and a multiplication cell 213 (second multiplication cell 213*b*) arranged between the driving line 210 and the second output line 211*b* are provided adjacent to each other. In other words, the first multiplication cell 213*a* and the second multiplication cell 213*b* connected to the common driving line 210 are arranged along the one input line 212.

The multiply-accumulate operation apparatus 200 is configured by units of this pair of the first and second multiplication cells 213*a* and 213*b*. Hereinafter, the region occupied by the pair of the first and second multiplication cells 213*a* and 213*b* will be referred to as a pair region 4. In FIG. 1, the pair region 4 in the XY plane is depicted as a rectangular region with the thick and solid line. Moreover, storage regions 5 at which data is stored in the first and second multiplication cells 213*a* and 213*b* are depicted as circular regions with the thick and solid line.

As described above, in this embodiment, the output line 211 includes the first output line 211*a* and the second output line 211*b* arranged on the both sides of the driving line 210. Then, the multiply-accumulate operation apparatus 200 is constituted by pairs of multiplication cells 213, each of which includes the first multiplication cell 213*a* connected to the input line 212 and the first output line 211*a* and the second multiplication cell 213*b* connected to the input line 212, which is common to the first multiplication cell 213, and the second output line 211. The first and second output lines 211*a* and 211*b* are, for example, the positive output line 211 and the negative output line 211 that have been described above. Accordingly, the multiply-accumulate operation apparatus 200 capable of performing a multiply-accumulate operation appropriately is realized even in a case where the positive and negative weight values and the positive and negative input values are used.

As shown in FIG. 11, an active layer 221 of each multiplication cell 213 is arranged obliquely to the input line 212. Directions in which the active layers 221 of the respective multiplication cells 213 extend are typically set to be an identical direction. By arranging the active layer 221 obliquely to the input line 212 in this manner, it is possible to greatly reduce the size in the X direction orthogonal to the input line 212, and it is possible to reduce the size of the pair region 4.

Moreover, in this embodiment, the first and second multiplication cells 213*a* and 213*b* are connected to the common driving line 210. Accordingly, it is possible to greatly reduce the size in the Y direction parallel to the input line 212. As a result, it is possible to greatly reduce the size in the Y direction of the pair region 4 as compared to a case where the first and second multiplication cells 213*a* and 213*b* are connected to different driving lines 210, for example. As a result, it is possible to achieve sufficient shrinking, and it is possible to achieve reduction in size of the device, improvement of the arithmetic operation capability, and the like.

In the example shown in FIG. 11, out of the input lines 212 adjacent to each other, the first multiplication cell 213*a* that connects to one input line 212 and the second multiplication cell 213*b* that connects to the other input line 212 are connected to the driving line 210 both via the same contact region 231. In this manner, the contact region 231 can be thus shared in the two multiplication cells 213. Accordingly, it is possible to sufficiently reduce the size in the X direction.

A cross-sectional structure of the first multiplication cell 213*a* connected to the second input line 212 from the left in FIG. 11 is schematically shown on the left side of FIG. 12A. Moreover, a cross-sectional structure of the second multiplication cell 213*b* connected to the third input line 212 from the left in FIG. 11 is schematically shown on the right side of FIG. 12A. As shown in FIGS. 12A and 12B, the multiplication cell 213 includes the active layer 221 formed on a semiconductor substrate 214, a ferroelectric film 226 (memory layer 220) and a gate electrode 224 stacked in a layer above a channel region 230 of the active layer 221, and the contact electrode 222 that connects the contact region 231 of the active layer 221 to the driving line 210, the output line 211, or the like. It should be noted that the gate electrode 224 functions as the input line 212.

As described above, the configuration of the multiplication cell 213 is substantially identical to the configuration of the memory cell 13 described with reference to FIGS. 1, 2A and 2B and the like. In other words, the multiplication cell 213 is configured by using a ferroelectric FET (FeFET) that can be utilized as the memory cell 13. That is, it can also be said that the multiplication cell 213 is a device that performs multiplication processing by using the memory cell 13.

FIGS. 13A, 13B, 13C and 13D are schematic diagrams showing a configuration example of another cross-section of the device structure of the multiply-accumulate operation apparatus 200. FIGS. 13A, 13B, 13C and 13D schematically shows a see-through plan view FIG. 13A as the semiconductor substrate 214 (multiply-accumulate operation apparatus 200) is viewed in the Z direction, a cross-sectional view FIG. 13B taken along the BB line, which is described in the see-through plan view FIG. 13A, a cross-sectional view FIG. 13C taken along the CC line, and a cross-sectional view FIG. 13D taken along the DD line.

The multiply-accumulate operation apparatus 200 (multiplication cell 213) can be formed by a manufacturing technology for a nonvolatile memory and the like. Accordingly, it is possible to easily achieve shrinking of the multiply-accumulate operation apparatus 200. For example, the manufacturing method for the nonvolatile storage apparatus 100, which has been described with reference to FIGS. 3A, 3B, 3C, 3D, 4A, 4B, 4C, 4D, 5A, 5B, 50, 5D, 6A, 6B, 6C, 6D, 7A, 7B, 7C, 7D, 8A, 8B, 8C and 8D, is applied.

The BB line is a line crossing the storage region 5 of the first multiplication cell 213 in the X direction. Therefore, the active layer 221 (channel region 230) is formed in a layer below the gate electrode 224 (ferroelectric film 226) shown in the cross-sectional view (b). Moreover, the CC line is a line crossing the driving line 210 in the X direction. Thus, device isolation layers 215 that isolate the respective contact regions 231 are provided directly under the gate electrode 224 (ferroelectric film 226) shown in the cross-sectional view (c). Moreover, the DD line is a line crossing the region in which the contact electrode is provided in the Y direction. In the cross-sectional view (d), three contact regions 231 arranged in the Y direction are shown. Out of them, the contact region 231 in the middle is a contact region 231 at which the two adjacent multiplication cells 213 in the X direction connect to the driving line 210.

By arranging the active layers 221 obliquely to the input lines 212 (gate electrodes 224) in the multiply-accumulate operation apparatus 200 as described above, the intervals of the adjacent multiplication cells 213 can be reduced. Accordingly, it is possible to reduce the areas of the multiplication cells 213, and shrinking of the apparatus can be achieved. Moreover, the lay-out area is reduced, and therefore necessary substrate size and the like are reduced and the manufacturing costs can be reduced.

Moreover, in this embodiment, the gate electrode 224 arranged to be orthogonal to the output line 211 (Dendrite) is used as the input line 212 (Axon). Accordingly, for example, the parasitic capacitance between Axon and Dendrite can be sufficiently reduced. As a result, it is possible to reduce the consumption current, and it is possible to realize the multiply-accumulate operation apparatus 200 that operates with lower power consumption.

Figures 14A, 14B, 14C:
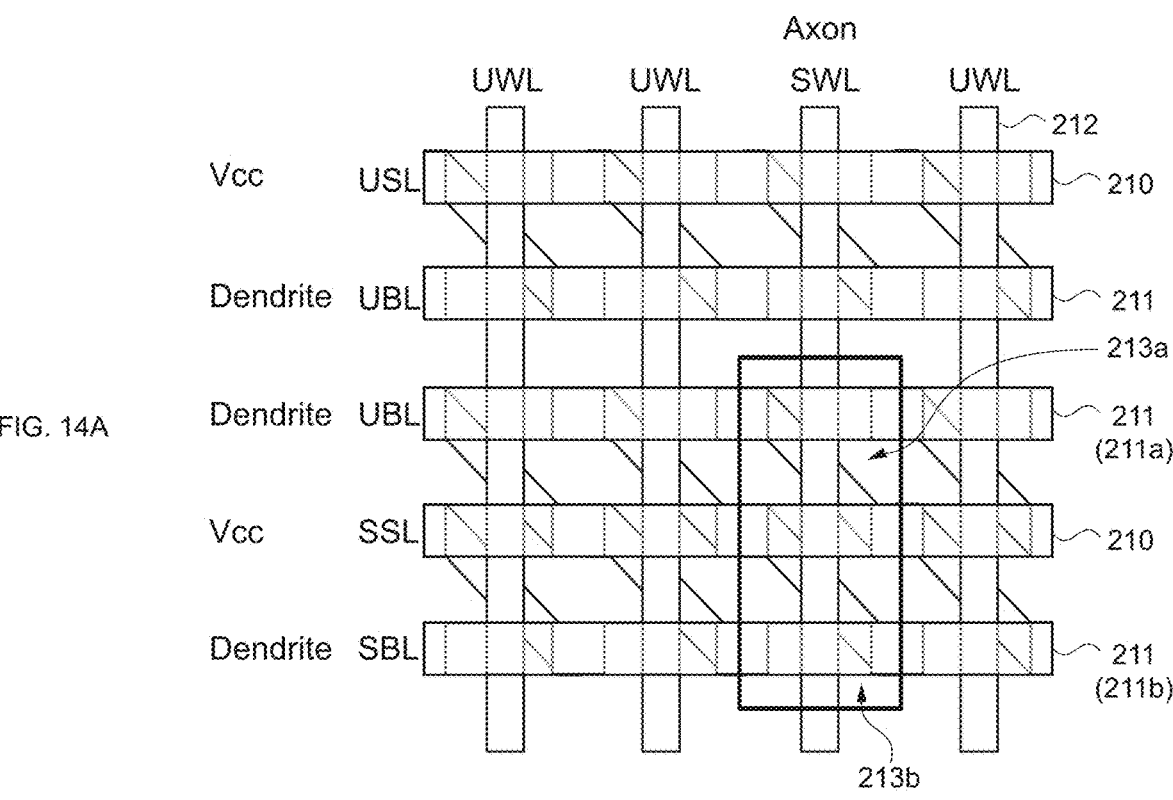
FIGS. 14A, 14B and 14C A diagrams for describing a write operation of a weight value and an arithmetic operation in the multiply-accumulate operation apparatus.

FIGS. 14A, 14B and 14C are diagrams for describing write operation and arithmetic operation for weight values in the multiply-accumulate operation apparatus 200. FIG. 14A is a see-through plan view described with reference to FIG. 11 and shows a state in which the multiplication cell 213 that sets the weight value is selected. FIG. 14B is a table showing an example of a voltage of each wire for writing the weight value in the multiplication cell 213. FIG. 14C is a table showing an example of a voltage of each wire when performing the multiply-accumulate operation (MAC).

In the multiply-accumulate operation apparatus 200, a predetermined weight value is set for each multiplication cell 213 before the multiply-accumulate operation is performed. For example, the model for the neural network and the like implemented in the multiply-accumulate operation apparatus 200 is designed by simulation using a computer and the like. The weight value calculated by such simulation is set for each multiplication cell 213. Hereinafter, the multiplication cell 213 selected as the target of the operation of writing the weight value will be referred to as the selected multiplication cell 213.

The processing of setting the weight value to the selected multiplication cell 213 can be, for example, performed in a manner similar to the processing of writing data in a selected memory cell described with reference to FIGS. 9A and 9B and the like. Here, the driving line 210, the output line 211, and the input line 212 that are connected to the selected multiplication cell 213 will be referred to as the selected driving line 210 (SSL), the selected output line 211 (SBL), and the selected input line 212 (SWL), respectively. Moreover, the other driving lines 210, the other output lines 211, and the other input lines 212 that are not connected to the selected multiplication cell 213 will be referred to as the unselected driving lines 210 (USL), the unselected output lines 211 (UBL), and the unselected input lines 212 (UWL), respectively.

In FIG. 14A, the second multiplication cell 213*a* that is arranged in the lower set of wires and connects to the third input line 212 from the left is the selected multiplication cell 213. It should be noted that the first multiplication cell 213*b* corresponding to this multiplication cell 213 is the unselected multiplication cell 213.

As shown in FIG. 14B, in a case of writing data of the weight value=1 (Write "1"), the selected input line 212 (SWL) is set to have a write voltage Vw. Vw is a program voltage and is a voltage necessary for polarizing the ferroelectric film 226 (FeFET) that is the memory layer 220. At that time, the voltage of the selected driving line 210 (SSL) and the selected output line 211 (SBL) is set to zero. Moreover, the voltage of the P-well regions is set to zero. As a result, the write voltage Vw is applied on the ferroelectric film 226 of the selected multiplication cell 213, and "1" is written as the data.

Moreover, the unselected input lines 212 (UWL) in a case of writing the weight value=1 is set to have a voltage (⅓ Vw) that is ⅓ of the write voltage Vw. Moreover, the unselected driving lines 210 (USL) and the unselected output lines 211 (UBL) are set to have a voltage (⅔ Vw) that is ⅔ of the write voltage Vw. Accordingly, a voltage lower than Vw is applied on the ferroelectric film 226 of the unselected multiplication cell 213 and the polarization is not generated. As a result, in the unselected multiplication cell 213, writing of the weight value does not occur and the write-disturb and the like can be avoided. It should be noted that a current flows through the unselected multiplication cell 213 (multiplication cell 213 paired with the selected multiplication cell 213) that is connected to the selected input line 212 (SWL), to the selected driving line 210 (SSL), and to the unselected output line (UBL) because the voltage that is ⅔ Vw is applied between the source and the drain.

Next, an operation when performing the multiply-accumulate operation will be described. In a case of performing the multiply-accumulate operation, for example, an input signal representing an input value is input into each of the plurality of input lines 212 (Axon) in a predetermined input period, and a signal representing a product value of the input value and the weight value is generated from each multiplication cell 213. Therefore, in a case of performing the multiply-accumulate operation, all the multiplication cells 213 (all the wires) enter an operation state. Hereinafter, the voltage of the input signal will be referred to as a signal voltage Vr.

As shown in FIG. 14C, in a case of performing the multiply-accumulate operation (MAC), the input signal having the signal voltage Vr is input into each the input line 212 (Axon). Moreover, each driving line 210 (Vcc) is set to have the driving voltage Vcc. Moreover, the voltage or current of each output line 211 (Dendrite) takes a value corresponding to the multiply-accumulate result (sum of product values), and therefore it is detected by the output unit 218 as the detection target (Sense). It should be noted that in the nMOSFET-type multiplication cell 213, the driving voltage Vcc is set to be a voltage higher than the voltage of the output line 211. Thus, in a case of performing the multiply-accumulate operation, the contact region 231 connected to the driving line 210 is the drain and the contact region 231 connected to the output line 211 is the source.

In the output unit 218, for example, a timing when the voltage or current of the output line 211 (Dendrite) exceeds a predetermined threshold (timing of ignition) is detected and a signal representing a multiply-accumulate result is generated on the basis of the detection result. For example, as the sum of the product values increases, the timing of ignition becomes earlier. Therefore, the signal representing the multiply-accumulate result can be generated by detecting the timing when the output of Dendrite exceeds the threshold. Accordingly, neuromorphic operation that simulates neuron movement can be performed. In addition, an arbitrary method of calculating the multiply-accumulate result on the basis of the output of Dendrite may be used.

The multiply-accumulate operation is performed by sensing each of the plurality of multiplication cells 213 for the same period in the multiply-accumulate operation apparatus 200 as described above. For example, in a case of sensing a nonvolatile memory, a certain amount of current (e.g., 1 μA or more) for appropriately detecting each piece of data is required. On the other hand, in a case of performing the multiply-accumulate operation, it is unnecessary to detect a current value output from the individual multiplication cell 213, and it is possible to perform an arithmetic operation even with a small amount of current, and the power consumption can be greatly reduced.

Figures 15A, 15B:
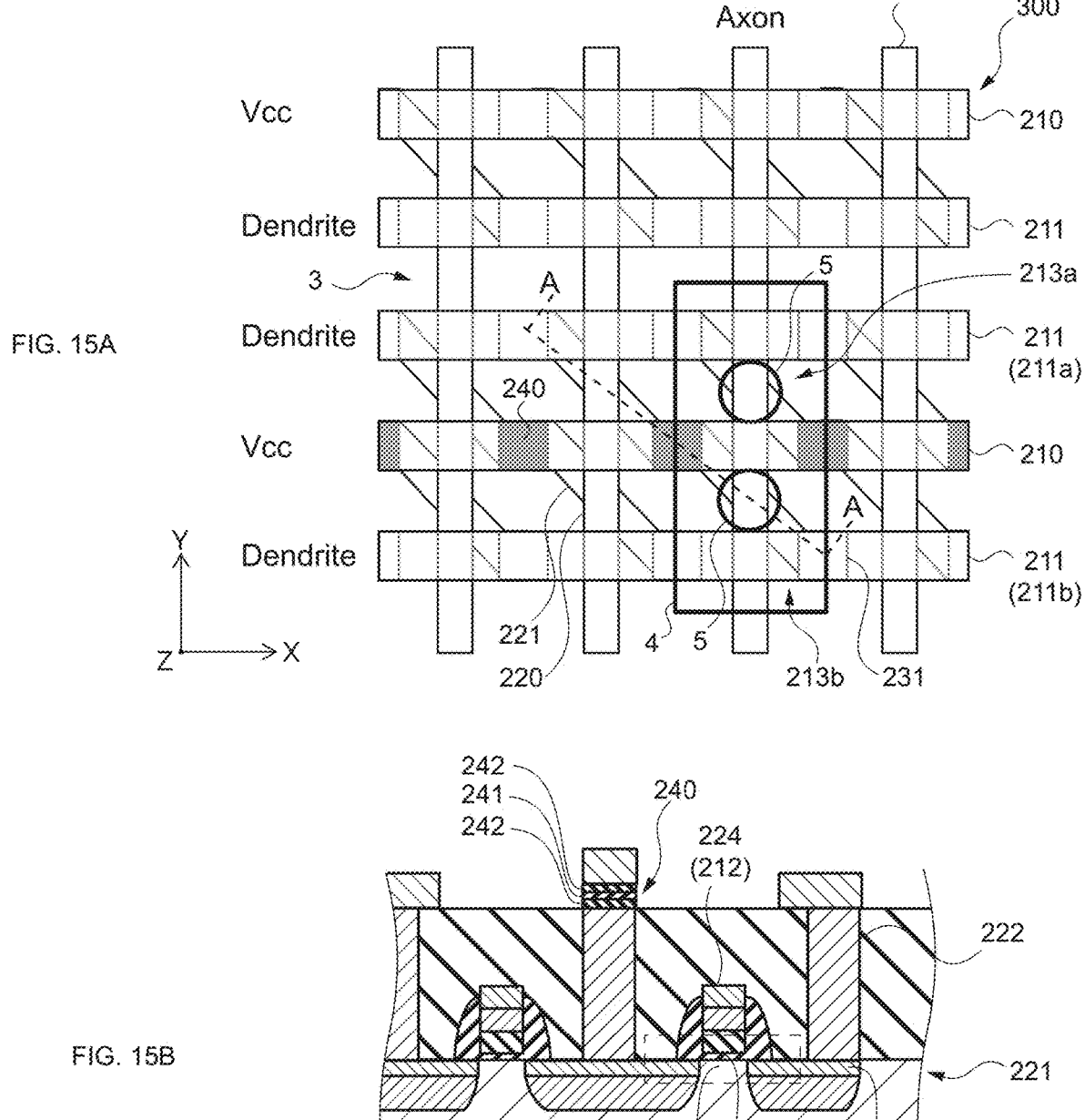
FIGS. 15A and 15B A schematic diagram showing a configuration example of another multiply-accumulate operation apparatus.

FIGS. 15A and 15B are schematic diagrams showing another configuration example of the multiply-accumulate operation apparatus. FIG. 15A is a see-through plan view of a multiply-accumulate operation apparatus 300 and FIG. 15B is a schematic cross-sectional view of the multiply-accumulate operation apparatus 300 taken along the AA line shown in FIG. 15A. The multiply-accumulate operation apparatus 300 shown in FIGS. 15A and 15B includes high-resistance elements 240 arranged between the driving line 210 and the active layer 221. It should be noted that as shown in FIGS. 15A and 15B, the lay-out of the wires and the like of the multiply-accumulate operation apparatus 300 is similar to the multiply-accumulate operation apparatus 200 described with reference to FIGS. 11, 12A and 12B and the like.

In the multiply-accumulate operation apparatus 300 shown in FIGS. 15A and 15B, the high-resistance elements 240 are inserted directly under the driving line 210. The high-resistance element 240 includes an insulating layer 241 having high resistance and metal layers 242 and is configured sandwiching the insulating layer 241 between the metal layers 242. Therefore, the high-resistance element 240 is an element including a capacitor structure in which the metal layers 242 are arranged facing each other via the insulating layer 241. The insulating layer 241 is formed from an insulative material having a high resistance value. For example, silicon dioxide (SiO2), silicon nitride (SiN), aluminum oxide (AlOx), hafnium oxide (HfOx), oxidization magnesium (MgOx), or the like is used as the insulating layer 241. Metal such as aluminum (Al) or a metal compound such as titanium nitride (TiN) and tantalum nitride (TaN) is used for the metal layers 242.

As described above with reference to FIG. 14B, in the configuration in which the first multiplication cell 213a and the second multiplication cell 213b are connected to the common driving line 210, there has been a case where unnecessary consumption current flows when weight values are written. For example, in the first and second multiplication cells 213a and 213b connected to the common input line 212 (gate electrode 224), there is a possibility that in a case of writing the weight value on one side, a consumption current may be generated between the source and drain on the other side.

In the multiply-accumulate operation apparatus 300 shown in FIGS. 15A and 15B, the contact electrode 222 that connects to the contact region that is the drain in the multiplication cell 213 is connected to the driving line 210 via the high-resistance element 240. By inserting the high-resistance element 240 on the drain side of the ferroelectric FET (multiplication cell 213) in this manner, a current supplied from the driving line 210 is reduced. Accordingly, the unnecessary consumption current generated during the write operation can be reduced. Moreover, the voltage of the driving line 210 is fixed at 0 during the write operation. Accordingly, it is possible to appropriately write the weight value in the selected multiplication cell 213.

In this embodiment, the high-resistance element 240 is configured as a resistance element having a resistance value of 1 MΩ or more. Accordingly, the resistance between the drain side of the multiplication cell 213 and the driving line 210 is 1 MΩ or more and the amount of current supplied to the multiplication cell 213 from the driving line 210 becomes sufficiently small. Accordingly, the consumption current can be sufficiently reduced while performing a normal write operation.

FIGS. 16A, 16B, 16C, 16D, 17A, 17B, 17C and 17D are plan views and cross-sectional views showing each step of the manufacturing method for the multiply-accumulate operation apparatus 300 shown in FIGS. 15A and 15B. FIGS. 16A, 16B, 16C, 16D shows a step of forming the high-resistance elements 240 in a layer above the contact electrodes 222. As shown in the cross-sectional views FIGS. 16C and 16D, the high-resistance elements 240 are formed in the layer above the contact electrodes 222 that connect to the driving lines 210. It should be noted that the high-resistance elements 240 are patterned as appropriate by etching, lift-off, and the like.

First of all, the metal layers 242 are deposited in a layer above the contact electrodes 222. Subsequently, the insulating layers 241 (e.g., SiO$_2$, SiN, AlO$_x$, HfO$_x$, MgO$_x$, or the like) are deposited in a layer above the metal layers 242. At that time, the film thickness of the insulating layer 241 is set to be, for example, approximately 1 to 10 nm. After that, the metal layers 242 are deposited in a layer above the insulating layers 241. Accordingly, a capacitor-type high-resistance element can be formed. The resistance value of the high-resistance elements 240 is, for example, set in such a range that the consumption current during the write operation decreases to an ignorable level. Here, it is set to be a resistance value of 1 MΩ or more.

FIGS. 17A, 17B, 17C and 17D shows a step of forming wires such as the driving lines 210 and the output lines 211. For example, a wire material such as Cu using a damascene structure is deposited and patterns of the driving lines 210 and the output lines 211 are formed. The patterns of the output lines 211 are formed to connect to the respective high-resistance elements 240 and the patterns of the output lines 211 are formed to connect to the contact electrodes 222 in an exposed state. Moreover, the wires of Al or the like can also be formed. After the respective wire are formed, a plurality of other wiring layers (not shown) is stacked as needed and contacts that connect between the respective layers are provided as appropriate. In this way, the peripheral circuit (output unit 218) and the CMOS circuit of the multiplication cell 213 are formed.

In accordance with the above-mentioned steps, the multiply-accumulate operation apparatus 300 shown in FIGS. 15A and 15B can be formed. It should be noted that the above-mentioned materials, numerical values, and the like are exemplary, and may be modified as appropriate in accordance with configurations and the like of the apparatus.

The method of constituting a circuit that performs the multiply-accumulate operation can include a method using resistive random access memories (ReRAM) and the like, for example. In the configuration using the ReRAM, the area and the power consumption can be reduced as compared to the case where the multiply-accumulate operation is configured with devices such as XNOR. On the other hand, with the ReRAM, it is difficult to ensure the resistance ratio of the high resistance (HRS) to the low resistance (LRS), and it is difficult to ensure a margin (e.g., noise margin) during the multiply-accumulate operation. Moreover, in a case where the nonvolatile FET is used for the multiply-accumulate operation, there is a possibility that in a case where Axon and a power supply line are arranged in parallel, data of a cell selected along Axon may be rewritten due to a potential difference from the power supply line.

In this embodiment, the active layer 221 of the multiplication cell 213 is arranged obliquely to the input line 212.

Accordingly, as shown in FIG. 11, in the multiply-accumulate operation apparatuses 200 and 300 in which the multiplication cells 213 are used as pairs, it is possible to arrange the multiplication cells 213 to be adjacent to each other, and shrinking of the device can be achieved. Moreover, the input line 212 (Axon) is arranged to be orthogonal to the driving line 210 (Vcc) and the output line 211 (Dendrite). Accordingly, during the write operation or the read operation, the write-disturb or read-disturb in which the data of the other unselected multiplication cells 213 arranged along the selected input line 212 is rewritten can be sufficiently avoided.

Moreover, in this embodiment, the MOSFET-type multiplication cell 213 (FeFET) having the ferroelectric film 226 as the memory layer 220 is used. Accordingly, the resistance ratio of the HRS/LRS increases, and the reading margin, the noise margin, and the like during the multiply-accumulate operation can be sufficiently ensured. As a result, the multiply-accumulate result can be accurately detected and the accuracy of the arithmetic operation can be improved. Moreover, because of the high resistance ratio, it can be operated at a sufficiently low current, and the multiply-accumulate operation apparatuses 200 and 300 with small power consumption can be configured.

Other Embodiments

The present technology is not limited to the above-mentioned embodiments, and various other embodiments can be realized.

In the above description, the multiply-accumulate operation apparatus in which the first and second output lines are arranged on the both sides of the driving line (Vcc) has been described. The present technology is not limited thereto, and for example, a circuit wired in a lay-out similar to that of the nonvolatile storage apparatus described with reference to FIG. 1 may be used as the multiply-accumulate operation apparatus. In this case, a pair of the driving line and the output line is formed as the wire pair and the multiplication cell that connects to the wire pair is provided. Accordingly, for example, a situation where the consumption current is generated when writing the weight value is avoided, and a multiply-accumulate operation apparatus with small power consumption can be realized.

Moreover, for example, a circuit wired in a lay-out similar to that of the multiply-accumulate operation apparatus described with reference to FIG. 11 may be used as the nonvolatile storage apparatus. That is, the first and second bit lines may be arranged on the both sides of the source line. In this case, the first and second memory cells that connect to the first and second bit lines are configured. For example, the first and second memory cells are controlled to write bit values (0 or 1) opposite to each other to thereby cause the first and second memory cells to function as one recording cell. Accordingly, double check of data can be performed, and the accuracy of reading can be improved.

Figure 18:
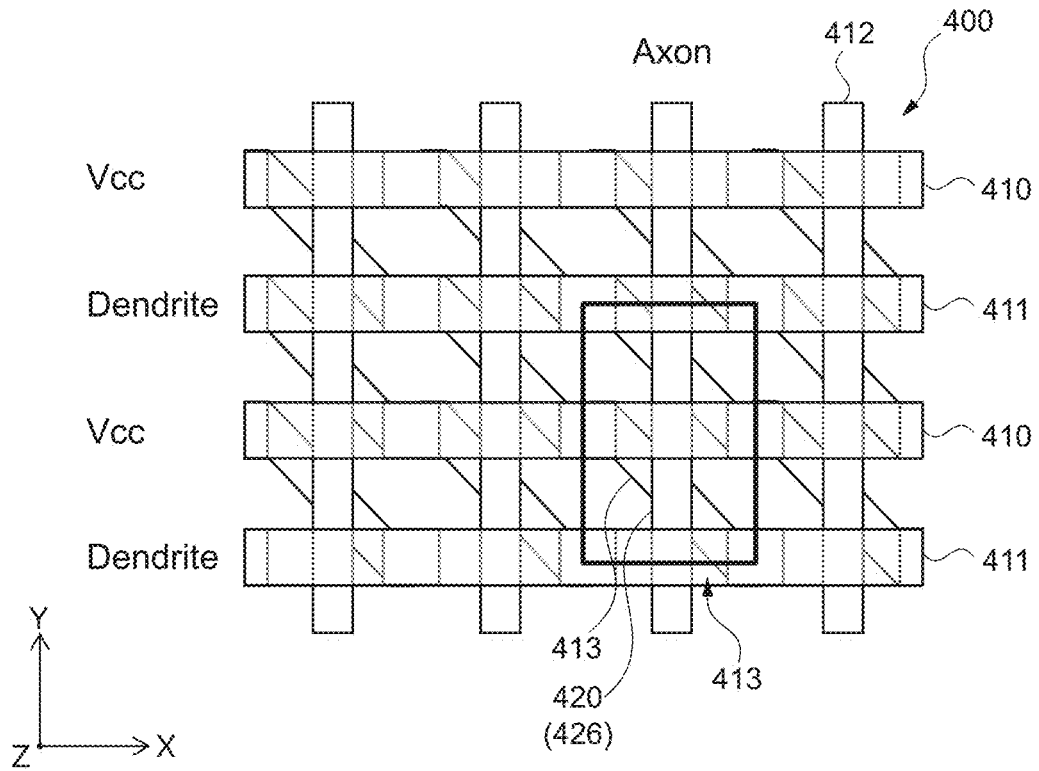
FIG. 18 A schematic diagram showing a configuration example of a multiply-accumulate operation apparatus according to another embodiment.

FIG. 18 is a schematic diagram showing a configuration example of a multiply-accumulate operation apparatus 400 according to another embodiment. In the multiply-accumulate operation apparatus 400 shown in FIGS. 16A, 16B, 16C and 16D, driving lines 410 (Vcc) and output lines 411 (Dendrite) are arranged in parallel and input lines 412 (Axon) are arranged to be orthogonal thereto. In this multiply-accumulate operation apparatus 400, isolation regions for isolating multiplication cells 413 adjacent to each other in the Y direction are not provided. Thus, the multiplication cells 413 adjacent to each other in the Y direction connect to either the common output line 411 or the common driving line 410. In this manner, in the multiply-accumulate operation apparatus 400, the multiplication cells 413 adjacent to each other along the input line 412 is connected to the common output line 411 or connected to the common driving line 410.

Also with such a configuration, by setting the voltage to be applied on each wire as appropriate, the voltage to be applied on a memory layer 420 (ferroelectric film 426) of the multiplication cell 413 can be individually controlled. Accordingly, the weight value can be written for each multiplication cell 413 and the multiply-accumulate operation can be appropriately performed. Moreover, in FIGS. 16A, 16B, 16C and 16D, both of the driving line 410 and the output line 411 can be used as common wires, and the size in the Y direction along the input line 412 can be sufficiently reduced. It should be noted that with the configuration shown in FIGS. 16A, 16B, 16C and 16D, a storage device such as a nonvolatile storage apparatus can also be configured.

In the above description, the ferroelectric FET (FeFET) is used as the memory cell and the multiplication cell (memory unit). The configuration of the memory unit is not limited. For example, the MOSFET-type device including the floating gate may be used as the memory unit. In this case, the floating gate functions as the nonvolatile memory layer. Alternatively, for example, a charge trap-type nonvolatile FET including an ONO film and the like may be used. In this case, the ONO film in which charges are accumulated functions as the nonvolatile memory layer. In addition, an arbitrary MOFET-type device including the nonvolatile memory function may be used as the memory unit.

At least two features of the features according to the present technology which have been described above may be combined. That is, the various features described in the respective embodiments may be arbitrarily combined across the respective embodiments. Moreover, the above-mentioned various effects are merely exemplary and not limitative, and other effects may be provided.

In the present disclosure, it is assumed that "the same", "equal", "orthogonal", and the like are concepts including "substantially the same", "substantially equal", "substantially orthogonal", and the like. For example, states included in a predetermined range (e.g., ±10% range) using "completely the same", "completely equal", "completely orthogonal", and the like as the basis are also included.

It should be noted that the present technology can also take the following configurations.

(1) A semiconductor device, including:
   a plurality of first wires arranged to be parallel to each other;
   a plurality of second wires arranged to be parallel and adjacent to the plurality of first wires, respectively;
   a plurality of third wires arranged to be orthogonal to the first wires and the second wires; and
   a plurality of MOSFET-type memory units each having
      a nonvolatile memory layer that maintains a state set via the third wire, and
      an active layer that is arranged obliquely to the third wire and electrically connects the first wire and the second wire adjacent to each other in accordance with the state of the memory layer.

(2) The semiconductor device according to (1), in which the memory layer is a gate dielectric film including ferroelectrics.

(3) The semiconductor device according to (1) or (2), in which the memory unit is an nMOSFET-type device.

(4) The semiconductor device according to any one of (1) to (3), in which the memory unit includes a first electrode portion that connects the active layer to the first wire, a second electrode portion that connects the active layer to the second wire, and a third electrode portion that is connected to the third wire and controls the state of the memory layer.

(5) The semiconductor device according to (4), in which the first electrode portion and the second electrode portion are arranged sandwiching the third wire.

(6) The semiconductor device according to any one of (1) to (5), in which the first wire is a source line, the second wire is a bit line, the third wire is a word line, and each of the plurality of memory units is a nonvolatile memory cell that outputs a state stored in the memory layer by being selected through the word line and the bit line.

(7) The semiconductor device according to (6), in which the source line and the bit line form one wire pair and are arranged such that arrangement relationships between the source lines and the bit lines in the wire pairs adjacent to each other are inverted.

(8) The semiconductor device according to (6), in which the source line and the bit line form one wire pair and are arranged such that arrangement relationships between the source lines and the bit lines in the wire pairs adjacent to each other are same.

(9) The semiconductor device according to any one of (1) to (8), in which the first wire is a driving line for supplying a driving voltage, the second wire is an output line, the third wire is an input line into which an input signal representing an input value is input, and each of the plurality of memory units is a multiplication cell that generates an electric charge corresponding to a product value obtained by multiplying a weight value corresponding to the state of the memory layer by the input value, and configures a multiply-accumulate operation apparatus by outputting an electric charge corresponding to the product value to the output line that is common.

(10) The semiconductor device according to (9), in which the output line includes a first output line and a second output line arranged on both sides of the driving line, and the multiply-accumulate operation apparatus is constituted by a pair of the multiplication cells including a first multiplication cell connected to the input line and the first output line and a second multiplication cell connected to the input line, which is common to the first multiplication cell, and the second output line.

(11) The semiconductor device according to (9) or (10), in which the driving voltage is a voltage higher than a voltage of the output line, and the multiplication cell is an nMOSFET-type device and includes a high-resistance element arranged between the active layer and the driving line.

(12) The semiconductor device according to (11), in which the high-resistance element is a resistance element having a resistance value of 1 M$\Omega$ or more.

(13) The semiconductor device according to any one of (1) to (12), further including an isolation region that is provided in a direction in which the first wires and the second wires extend, the memory unit being not formed in the isolation region, in which the memory units adjacent to each other along the third wire are isolated through the isolation region.

(14) The semiconductor device according to any one of (1) to (13), in which the memory units adjacent to each other along the third wire are connected to the second wire that is common.

(15) The semiconductor device according to any one of (1) to (14), in which a write voltage is applied on the memory layer of the memory unit of the plurality of memory units, which is a writing target, and a voltage that is one third of the write voltage or a voltage that is two thirds of the write voltage is applied on the memory layer of the other memory unit that is not the writing target.

(16) A nonvolatile storage apparatus, including:

a plurality of source lines arranged to be parallel to each other;

a plurality of bit lines arranged to be parallel and adjacent to the plurality of source lines, respectively;

a plurality of word lines arranged to be orthogonal to the source lines and the bit lines; and a plurality of MOSFET-type memory cells each having a nonvolatile memory layer that maintains a state set via the word line, and an active layer that is arranged obliquely to the word line and electrically connects the source line and the bit line adjacent to each other in accordance with the state of the memory layer.

(17) A multiply-accumulate operation apparatus, including:

a plurality of driving lines arranged to be parallel to each other;

a plurality of output lines arranged to be parallel and adjacent to each of the plurality of driving lines, respectively;

a plurality of input lines arranged to be orthogonal to the driving lines and the output lines; and a plurality of MOSFET-type multiplication cells each having a nonvolatile memory layer that maintains a state set via the input line, and an active layer that is arranged obliquely to the input line and electrically connects the driving line and the output line adjacent to each other in accordance with the state of the memory layer.

(18) The multiply-accumulate operation apparatus according to (17), in which an input signal representing an input value is input into each of the plurality of input lines, and each of the plurality of multiplication cells generates an electric charge corresponding to a product value obtained by multiplying a weight value corresponding to the state of the memory layer by the input value and outputs the electric charge to the output line, further including a plurality of output units that each outputs, on the basis of the electric charge output to the output line by a group of the multiplication cells connected to the output line that is common, a multiply-accumulate signal representing a sum of the product values in the group of the multiplication cells.

(19) The multiply-accumulate operation apparatus according to (18), in which a plurality of multiply-accumulate units each including the group of the multiplication cells and the output unit and capable of outputting the multiply-accumulate signal is connected in parallel to the plurality of input lines.

(20) A manufacturing method for a semiconductor device including a plurality of first wires arranged to be parallel to each other, a plurality of second wires arranged to be parallel and adjacent to the plurality of first wires, respectively, a plurality of third wires arranged to be orthogonal to the first wires and the second wires, and a plurality of MOSFET-type memory units, including:

in a manufacturing process for the memory units, forming active layers that electrically connect the first wires and the second wires adjacent to each other in accordance with states of memory layers, obliquely to the third wires; and forming the memory layers that maintain the states set via the third wires and are nonvolatile.

REFERENCE SIGNS LIST 3 isolation region
10 source line
11 bit line
12 word line
13 memory cell
20, 220, 420 memory layer
21, 221 active layer
22, 222 contact electrode
24, 224 gate electrode
26, 226, 426 ferroelectric film
100 nonvolatile storage apparatus
200, 300, 400 multiply-accumulate operation apparatus
210, 410 driving line
211, 411 output line
212, 412 input line
213, 413 multiplication cell
240 high-resistance element

The invention claimed is:

1. A semiconductor device, comprising:
a plurality of first wires in parallel;
a plurality of second wires in parallel and adjacent to the plurality of first wires, respectively;
a plurality of third wires orthogonal to the plurality of first wires and the plurality of second wires; and
a plurality of metal oxide semiconductor field effect transistor (MOSFET)-type memory units, wherein each MOSFET-type memory unit of the plurality of MOSFET-type memory units includes:
a nonvolatile memory layer configured to maintain a state set via a wire of the plurality of third wires, and
an active layer that is oblique to the wire of the plurality of third wires, wherein the active layer is configured to electrically connect, based on the state of the nonvolatile memory layer, a wire of the plurality of first wires and a wire of the plurality of second wires adjacent to the wire of the plurality of first wires, wherein each wire of the plurality of first wires is a driving line configured to supply a driving voltage, each wire of the plurality of second wires is an output line, each wire of the plurality of third wires is an input line that is configured to receive an input signal representing an input value, the driving voltage is a voltage higher than a voltage of the output line, each MOSFET-type memory unit of the plurality of MOSFET-type memory units is a multiplication cell that is configured to:

generate an electric charge corresponding to a product value that is obtained based on a multiplication of a weight value corresponding to the state of the nonvolatile memory layer and the input value;

output, to the output line, the electric charge corresponding to the product value; and configure a multiply-accumulate operation apparatus based on the electric charge outputted to the output line that is common to a plurality of multiplication cells, wherein the plurality of multiplication cells includes the multiplication cell, the multiplication cell is an nMOSFET-type device, the nMOSFET-type device includes a high-resistance element between the active layer and the driving line, and the high-resistance element is a resistance element having a resistance value of at least 1 MΩ.

2. The semiconductor device according to claim 1, wherein the nonvolatile memory layer is a gate dielectric film including ferroelectrics.

3. The semiconductor device according to claim 1, wherein each MOSFET-type memory unit of the plurality of MOSFET-type memory units includes:

a first electrode portion that connects the active layer to the wire of the plurality of first wires, a second electrode portion that connects the active layer to the wire of the plurality of second wires, and a third electrode portion that is connected to the wire of the plurality of third wires, and the third electrode portion is configured to control the state of the nonvolatile memory layer.

4. The semiconductor device according to claim 3, wherein the first electrode portion and the second electrode portion sandwich the wire of the plurality of third wires.

5. The semiconductor device according to claim 1, wherein each wire of the plurality of first wires is a source line, each wire of the plurality of second wires is a bit line, each wire of the plurality of third wires is a word line, each MOSFET-type memory unit of the plurality of MOSFET-type memory units is a nonvolatile memory cell configured to output the state stored in the nonvolatile memory layer, and the state is based on a selection of the nonvolatile memory cell through the word line and the bit line.

6. The semiconductor device according to claim 5, wherein a first source line of the plurality of first wires and a first bit line of the plurality of second wires form a first wire pair, a second source line of the plurality of first wires and a second bit line of the plurality of second wires form a second wire pair, and a first arrangement relationship between the first source line and the first bit line is inverted with respect to a second arrangement relationship between the second source line and the second bit line.

7. The semiconductor device according to claim 5, wherein a first source line of the plurality of first wires and a first bit line of the plurality of second wires form a first wire pair, a second source line of the plurality of first wires and a second bit line of the plurality of second wires form a second wire pair, and a first arrangement relationship between the first source line and the first bit line is same as a second arrangement relationship between the second source line and the second bit line.

8. The semiconductor device according to claim 1, wherein the output line includes a first output line and a second output line on both sides of the driving line, the multiply-accumulate operation apparatus is constituted by a pair of multiplication cells including:

a first multiplication cell connected to the input line and the first output line, and a second multiplication cell connected to the input line, which is common to the first multiplication cell, and the second output line, and the plurality of multiplication cells includes the pair of multiplication cells.

9. The semiconductor device according to claim 1, further comprising an isolation region in a direction in which the plurality of first wires and the plurality of second wires extend, wherein the isolation region excludes each of the MOSFET-type memory unit of the plurality of MOSFET-type memory units, a first MOSFET-type memory unit of the plurality of MOSFET-type memory units is adjacent to a second MOSFET-type memory unit of the plurality of MOSFET-type memory units along the plurality of third wires, and the first MOSFET-type memory unit is isolated from the second MOSFET-type memory unit through the isolation region.

10. The semiconductor device according to claim 1, wherein a first MOSFET-type memory unit of the plurality of MOSFET-type memory units is adjacent to a second MOSFET-type memory unit of the plurality of MOSFET-type memory units along the plurality of third wires, and the first MOSFET-type memory unit and the second MOSFET-type memory unit are connected to the wire of the plurality of second wires.

11. The semiconductor device according to claim 1, wherein a write voltage is applied on the nonvolatile memory layer of a first MOSFET-type memory unit of the plurality of MOSFET-type memory units, a voltage that is one third of the write voltage or a voltage that is two thirds of the write voltage is applied on the nonvolatile memory layer of a second MOSFET-type memory unit of the plurality of MOSFET-type memory units, the first MOSFET-type memory unit is a writing target, and the second MOSFET-type memory unit is not the writing target.

12. A nonvolatile storage apparatus, comprising:

a plurality of source lines in parallel;

a plurality of bit lines in parallel and adjacent to the plurality of source lines, respectively;

a plurality of word lines orthogonal to the plurality of source lines and the plurality of bit lines; and a plurality of metal oxide semiconductor field effect transistor (MOSFET)-type memory cells, wherein each MOSFET-type memory cell of the plurality of MOSFET-type memory cells includes:

a nonvolatile memory layer configured to maintain a state set via a word line of the plurality of word lines, and an active layer that is oblique to the word line of the plurality of word lines, wherein the active layer is configured to electrically connect, based on the state of the nonvolatile memory layer, a source line of the plurality of source lines and a bit line of the plurality of bit lines adjacent to the source line of the plurality of source lines, wherein each line of the plurality of the source lines is a driving line configured to supply a driving voltage, each bit line of the plurality of bit lines is an output line, each line of the plurality of word lines is an input line that is configured to receive an input signal representing an input value, the driving voltage is a voltage higher than a voltage of the output line, each MOSFET-type memory cell of the plurality of MOSFET-type memory cells is a multiplication cell that is configured to:

generate an electric charge corresponding to a product value that is obtained based on a multiplication of a weight value corresponding to the state of the nonvolatile memory layer and the input value;

output, to the output line, the electric charge corresponding to the product value; and configure a multiply-accumulate operation apparatus based on the electric charge outputted to the output line that is common to a plurality of multiplication cells, wherein the plurality of multiplication cells includes the multiplication cell, the multiplication cell is an nMOSFET-type device, the nMOSFET-type device includes a high-resistance element between the active layer and the driving line, and the high-resistance element is a resistance element having a resistance value of at least 1 MΩ.

13. A multiply-accumulate operation apparatus, comprising:

a plurality of driving lines in parallel;

a plurality of output lines in parallel and adjacent to the plurality of driving lines, respectively;

a plurality of input lines orthogonal to the plurality of driving lines and the plurality of output lines; and a plurality of metal oxide semiconductor field effect transistor (MOSFET)-type multiplication cells, wherein each MOSFET-type multiplication cell of the plurality of MOSFET-type multiplication cells includes:

a nonvolatile memory layer configured to maintain a state set via an input line of the plurality of input lines, and an active layer that is oblique to the input line of the plurality of input lines, wherein the active layer is configured to electrically connect, based on the state of the nonvolatile memory layer, a driving line of the plurality of driving lines and an output line of the plurality of output lines adjacent to the driving line of the plurality of driving lines, wherein each driving line of the plurality of driving lines is configured to supply a driving voltage, each input line of the plurality of input lines is configured to receive an input signal representing an input value, the driving voltage is a voltage higher than a voltage of the output line, each MOSFET-type multiplication cell of the plurality of MOSFET-type multiplication cells is a multiplication cell that is configured to:

generate an electric charge corresponding to a product value that is obtained based on a multiplication of a weight value corresponding to the state of the nonvolatile memory layer and the input value;

output, to the output line of the plurality of output lines, the electric charge corresponding to the product value; and configure a multiply-accumulate operation device based on the electric charge outputted to the output line that is common to a plurality of multiplication cells, wherein the plurality of multiplication cells includes the multiplication cell, the multiplication cell is a nMOSFET-type device, the multiplication cell includes a high-resistance element between the active layer and a driving line of the plurality of driving lines, and the high-resistance element is a resistance element having a resistance value of at least 1 MΩ.

14. The multiply-accumulate operation apparatus according to claim 13, wherein the output line is common to a group of MOSFET-type multiplication cells among the plurality of MOSFET-type multiplication cells, the multiply-accumulate operation apparatus further comprises a plurality of output accumulation circuits, and each output accumulation circuit of the plurality of output accumulation circuits is configured to:

receive and sum electric charges from the group of MOSFET-type multiplication cells connected to the output line; and output a multiply-accumulate signal that represents a sum of product values in the group of MOSFET-type multiplication cells.

15. The multiply-accumulate operation apparatus according to claim 14, further comprising a plurality of multiply-accumulate circuits, wherein each multiply-accumulate circuit of the plurality of multiply-accumulate circuits includes the group of MOSFET-type multiplication cells, and an output accumulation circuit of the plurality of output accumulation circuits, and the plurality of multiply-accumulate circuits is connected in parallel to the plurality of input lines.

16. A manufacturing method, comprising:

for a semiconductor device including a plurality of first wires in parallel, a plurality of second wires in parallel and adjacent to the plurality of first wires, respectively, a plurality of third wires arranged orthogonal to the plurality of first wires and the plurality of second wires, and a plurality of metal oxide semiconductor field effect transistor (MOSFET)-type memory units, forming a plurality of nonvolatile memory layers configured to maintain states set via the plurality of third wires, wherein each state of the states includes a state of a nonvolatile memory layer of the plurality of nonvolatile memory layers; and forming a plurality of active layers oblique to the plurality of third wires, wherein the plurality of active layers is configured to electrically connect, based on the state of the nonvolatile memory layer, the plurality of first wires and the plurality of second wires adjacent to the plurality of first wires, wherein each wire of the plurality of first wires is a driving line configured to supply a driving voltage, each wire of the plurality of second wires is an output line, each wire of the plurality of third wires is an input line that is configured to receive an input signal representing an input value, the driving voltage is a voltage higher than a voltage of the output line, each MOSFET-type memory unit of the plurality of MOSFET-type memory units is a multiplication cell that is configured to:

generate an electric charge corresponding to a product value that is obtained based on a multiplication of a weight value corresponding to the state of the nonvolatile memory layer and the input value;

output, to the output line, the electric charge corresponding to the product value; and configure a multiply-accumulate operation apparatus based on the electric charge outputted to the output line that is common to a plurality of multiplication cells, wherein the plurality of multiplication cells includes the multiplication cell, the multiplication cell is an nMOSFET-type device, the multiplication cell includes a high-resistance element between the active layer and the driving line, and the high-resistance element is a resistance element having a resistance value of at least 1 MΩ.

17. A semiconductor device, comprising:

a plurality of first wires in parallel;

a plurality of second wires in parallel and adjacent to the plurality of first wires, respectively;

a plurality of third wires orthogonal to the plurality of first wires and the plurality of second wires; and a plurality of metal oxide semiconductor field effect transistor (MOSFET)-type memory units, wherein each MOSFET-type memory unit of the plurality of MOSFET-type memory units includes:

a nonvolatile memory layer configured to maintain a state set via a wire of the plurality of third wires, and an active layer that is oblique to the wire of the plurality of third wires, wherein the active layer is configured to electrically connect, based on the state of the nonvolatile memory layer, a wire of the plurality of first wires and a wire of the plurality of second wires adjacent to the wire of the plurality of first wires, wherein each wire of the plurality of first wires is a driving line configured to supply a driving voltage, each wire of the plurality of second wires is an output line, each wire of the plurality of third wires is an input line that is configured to receive an input signal representing an input value, the driving voltage is a voltage higher than a voltage of the output line, each MOSFET-type memory unit of the plurality of MOSFET-type memory units is a multiplication cell that is configured to:

generate an electric charge corresponding to a product value that is obtained based on a multiplication of a weight value corresponding to the state of the nonvolatile memory layer and the input value;

output, to the output line, the electric charge corresponding to the product value; and configure a multiply-accumulate operation apparatus based on the electric charge outputted to the output line that is common to a plurality of multiplication cells, wherein the plurality of multiplication cells includes the multiplication cell, the multiplication cell is a nMOSFET-type device, and the multiplication cell includes a high-resistance element between the active layer and the driving line.

* * * * *